(12) United States Patent
Yamada et al.

(10) Patent No.: US 9,329,322 B2
(45) Date of Patent: May 3, 2016

(54) LUMINOUS FLUX CONTROL MEMBER, LIGHT EMITTING APPARATUS, AND ILLUMINATING APPARATUS

(71) Applicant: Enplas Corporation, Saitama (JP)

(72) Inventors: Kyouhei Yamada, Saitama (JP); Noriyuki Kawahara, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 14/394,856

(22) PCT Filed: Apr. 16, 2013

(86) PCT No.: PCT/JP2013/002550
§ 371 (c)(1),
(2) Date: Oct. 16, 2014

(87) PCT Pub. No.: WO2013/157243
PCT Pub. Date: Oct. 24, 2013

(65) Prior Publication Data
US 2015/0070930 A1    Mar. 12, 2015

(30) Foreign Application Priority Data

Apr. 17, 2012 (JP) ................................ 2012-093813
Nov. 30, 2012 (JP) ................................ 2012-263162
Mar. 8, 2013 (JP) ................................ 2013-046735

(51) Int. Cl.
*F21V 7/04*    (2006.01)
*F21V 8/00*    (2006.01)
(Continued)

(52) U.S. Cl.
CPC ................ *G02B 6/0031* (2013.01); *F21V 5/00* (2013.01); *F21V 5/04* (2013.01); *G02B 5/02* (2013.01);
(Continued)

(58) Field of Classification Search
CPC ............. G02B 19/0028; G02B 6/0038; G02B 6/0048; G02B 6/0051; G02B 6/0031; G02B 6/0078; G02B 6/0058; G02B 6/0018; G02B 17/08; G02B 5/02; G02B 6/0038; F21V 5/008; F21V 7/0091; F21S 48/1329; F21S 48/2237; F21S 48/236; F21S 48/24; F21S 48/2243; F21S 48/225; F21S 48/2268; F21S 48/2281; F21S 48/2287
See application file for complete search history.

(56) References Cited

U.S. PATENT DOCUMENTS 5,046,805 A * 9/1991 Simon ............................ 385/31
6,097,549 A * 8/2000 Jenkins et al. ................ 359/726
(Continued)

FOREIGN PATENT DOCUMENTS

JP    04-055002 U    5/1992
JP    10-173870 A    6/1998
(Continued)

OTHER PUBLICATIONS

Extended European Search Report dated Apr. 17, 2015 for corresponding EP Application No. 13777893.2.

*Primary Examiner* — Y M Lee
(74) *Attorney, Agent, or Firm* — Brundidge & Stanger, P.C.

(57) ABSTRACT

A luminous flux control member (200) of the present invention has: a light input surface (210); total reflection surfaces (220), which are formed at positions facing a light emitting element with the light input surface (210) therebetween; two light guide sections (230), which are formed such that respective cross-sectional areas thereof are reduced in the direction to be away from the light input surface (210) and the total reflection surface (220), said light guide sections being formed at facing positions with the light input surface (210) and the total reflection surface (220) therebetween; and two light output surfaces (240), which are formed on the outer surfaces of the two light guide sections (230), respectively.

9 Claims, 33 Drawing Sheets

(51) Int. Cl.
  *F21V 5/00* (2015.01)
  *F21V 5/04* (2006.01)
  *G02B 17/08* (2006.01)
  *G02B 5/02* (2006.01)
  *F21K 99/00* (2016.01)
  *F21S 4/00* (2016.01)
  *F21Y 101/02* (2006.01)
  *F21Y 103/00* (2016.01)
  *H01L 33/58* (2010.01)

(52) U.S. Cl.
  CPC ............ *G02B 6/0018* (2013.01); *G02B 6/0051* (2013.01); *G02B 6/0058* (2013.01); *G02B 6/0078* (2013.01); *G02B 17/08* (2013.01); *F21K 9/17* (2013.01); *F21K 9/50* (2013.01); *F21S 4/003* (2013.01); *F21Y 2101/02* (2013.01); *F21Y 2103/003* (2013.01); *G02B 6/0021* (2013.01); *H01L 33/58* (2013.01)

(56) References Cited

U.S. PATENT DOCUMENTS

| | | |
|---|---|---|
| 2006/0187676 A1 | 8/2006 | Ishikura |
| 2007/0147073 A1 | 6/2007 | Sakai et al. |
| 2009/0059125 A1 | 3/2009 | Nagayoshi et al. |
| 2010/0195315 A1* | 8/2010 | Ohkawa ................ 362/97.1 |
| 2011/0068686 A1 | 3/2011 | Osawa |
| 2011/0194034 A1 | 8/2011 | Shimizu |
| 2011/0249462 A1 | 10/2011 | Koizumi et al. |

FOREIGN PATENT DOCUMENTS

| | | |
|---|---|---|
| JP | 2007-087757 A | 4/2007 |
| JP | 2009-026554 A | 2/2009 |
| JP | 2010-067367 A | 3/2010 |
| JP | 2011-134509 A | 7/2011 |
| JP | 2011-222339 A | 11/2011 |
| WO | 2009/151026 A1 | 12/2009 |

* cited by examiner

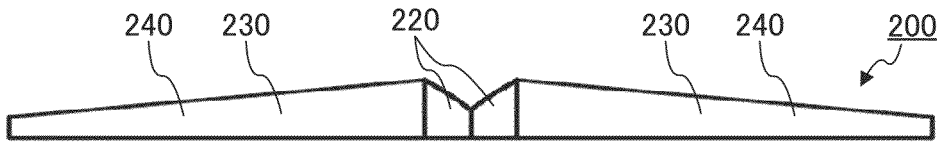
FIG. 3A
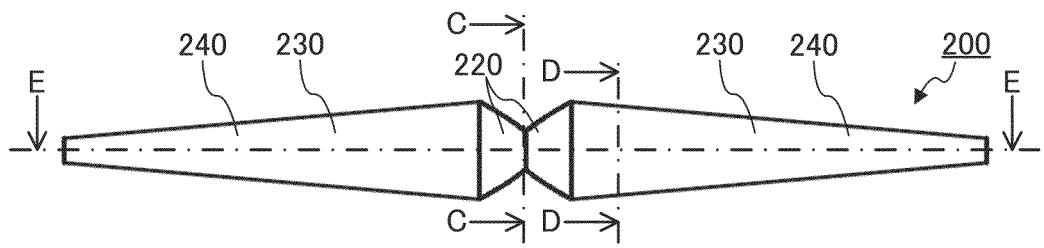
FIG. 3B
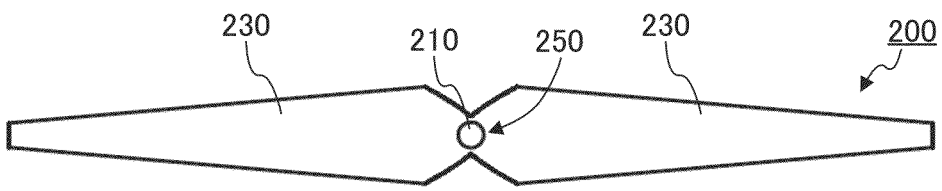
FIG. 3C
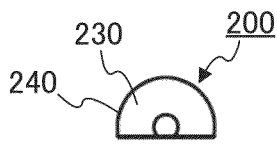     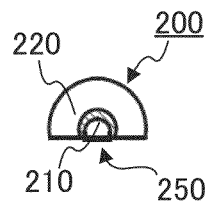     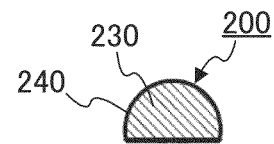
FIG. 3D          FIG. 3E          FIG. 3F
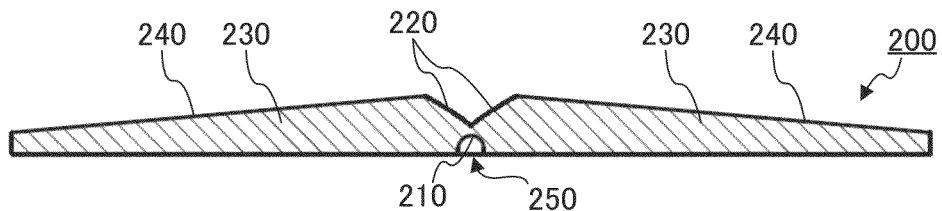
FIG. 3G

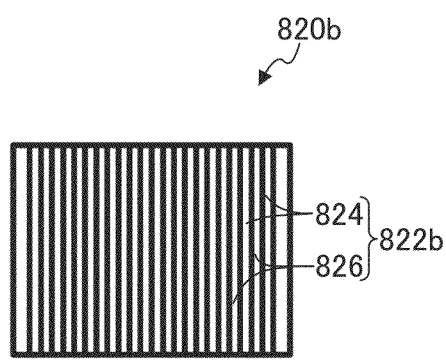
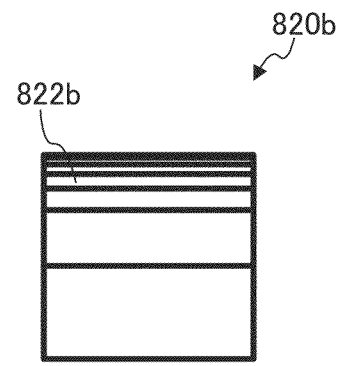
FIG. 19A	FIG. 19B
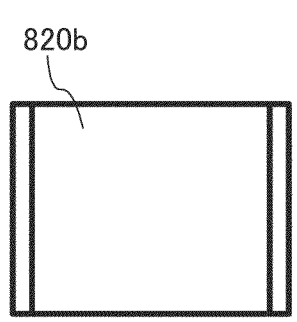
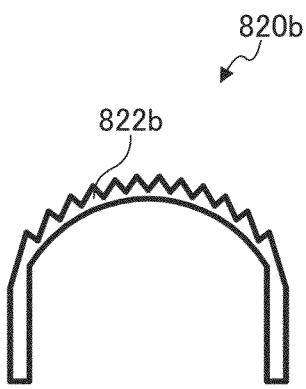
FIG. 19C	FIG. 19D

LUMINOUS FLUX CONTROL MEMBER, LIGHT EMITTING APPARATUS, AND ILLUMINATING APPARATUS

TECHNICAL FIELD

The present invention relates to a light flux controlling member that controls the travelling direction of light emitted from a light emitting element, a light-emitting device including the light flux controlling member, and an illumination apparatus including the light-emitting device.

BACKGROUND ART

In recent years, in view of energy saving and environmental conservation, illumination apparatus (such as LED bulbs and LED fluorescent tubes) using a light-emitting diode (hereinafter also referred to as "LED") as a light source have been increasingly replacing electric light bulbs and fluorescent tubes. In generally used LED fluorescent tubes, a plurality of LEDs are disposed on a substrate at a predetermined interval, and a cover is disposed so as to cover the LEDs (see, for example, PTL 1).

CITATION LIST

Patent Literature

PTL 1
WO2009/151026

SUMMARY OF INVENTION

Technical Problem

However, the conventional LED fluorescent tubes have a problem that bright spots corresponding to LEDs are seen through the cover, and the luminance unevenness is significant. It is conceivable to increase the number of LEDs or reduce the light transmittance of the cover in order to make the bright spots less noticeable; however, such solutions to the problem are not preferable in view of energy saving.

An object of the present invention is to provide a light flux controlling member that can control the distribution of light emitted from light emitting elements such that, when the light is applied to an illumination apparatus (for example, an LED fluorescent tube) having light emitting elements and a cover, the cover can be uniformly irradiated with light from a small number of light emitting elements.

In addition, another object of the present invention is to provide a light-emitting device including the light flux controlling member, and an illumination apparatus including the light-emitting device.

Solution to Problem

A light flux controlling member of an embodiment of the present invention is configured to control a distribution of light emitted from a light emitting element, and the light flux controlling member includes: an incidence surface on which at least part of light emitted from a light emitting element is incident; a total reflection surface formed at a position facing the light emitting element with the incidence surface therebetween, the total reflection surface being configured to reflect part of light incident on the incidence surface in two opposite directions substantially perpendicular to an optical axis of the light emitting element; two light guiding sections formed at positions facing each other with the incidence surface and the total reflection surface therebetween, the two light guiding sections being configured to guide part of light incident on the incidence surface and light reflected by the total reflection surface in a direction away from the incidence surface and the total reflection surface; and two emission surfaces formed on respective external surfaces of the two light guiding sections, the two emission surfaces being configured to output light guided by the light guiding sections.

A light-emitting device of an embodiment of the present invention includes: the light flux controlling member of the embodiment of the present invention; and a light emitting element disposed at a position facing the incidence surface.

An illumination apparatus of an embodiment of the present invention includes: the light-emitting device of the embodiment of the present invention; and a cover that is disposed in such a manner as to cover the light-emitting device with an air layer interposed between the light-emitting device and the cover.

Advantageous Effects of Invention

According to the present invention, an illumination apparatus (for example, an LED fluorescent tube) with high energy efficiency and small luminance unevenness can be provided.

BRIEF DESCRIPTION OF DRAWINGS

FIG. 3A is a front view of a light flux controlling member of Embodiment 1, FIG. 3B is a plan view of the light flux controlling member of Embodiment 1, FIG. 3C is a bottom view of the light flux controlling member of Embodiment 1, FIG. 3D is a side view of the light flux controlling member of Embodiment 1, FIG. 3E is a sectional view taken along line C-C of FIG. 3B, FIG. 3F is a sectional view taken along line D-D of FIG. 3B, and FIG. 3G is a sectional view taken along line E-E of FIG. 3B;

FIG. 19A is a front view of a diffusing member of a second modification of Embodiment 4, FIG. 19B is a plan view of the diffusing member of the second modification of Embodiment 4, FIG. 19C is a bottom view of the diffusing member of the second modification of Embodiment 4, and FIG. 19D is a side view of the diffusing member of the second modification of Embodiment 4;

DESCRIPTION OF EMBODIMENTS

In the following, embodiments of the present invention will be described in detail with reference to the accompanying drawings. The following description explains an illumination apparatus which can be used in place of fluorescent tubes, as a typical example of the illumination apparatus of the embodiments of the present invention.

[Embodiment 1]

(Configuration of Illumination Apparatus)

Figure 1A:
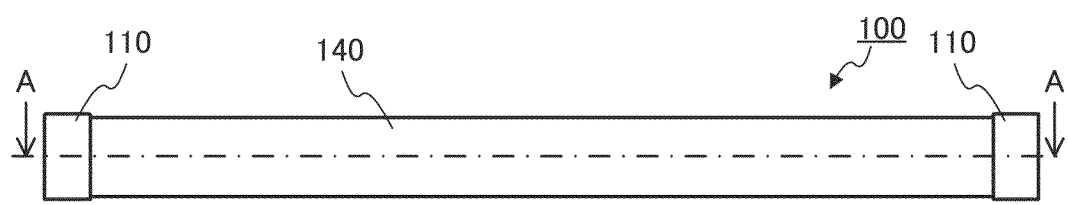
FIG. 1A is a plan view of an illumination apparatus of Embodiment 1.
Figure 1B:
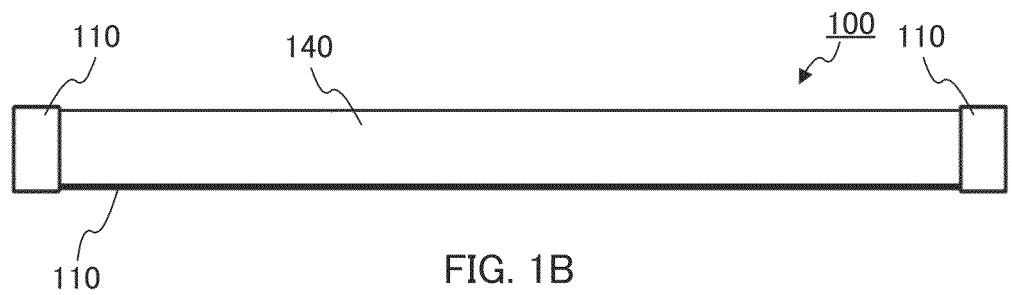
FIG. 1B is a front view of the illumination apparatus of Embodiment 1.
Figure 1C:
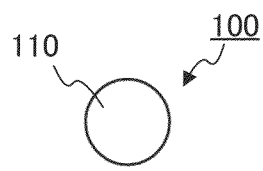
FIG. 1C is a side view of the illumination apparatus of Embodiment 1.
Figure 2A:
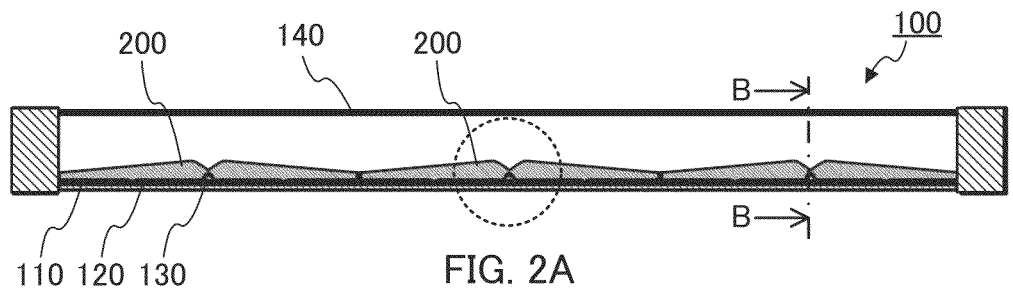
FIG. 2A is a sectional view taken along line A-A of FIG. 1A.
Figure 2B:
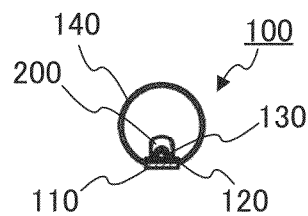
FIG. 2B is a sectional view taken along line B-B of FIG. 2A.
Figure 2C:
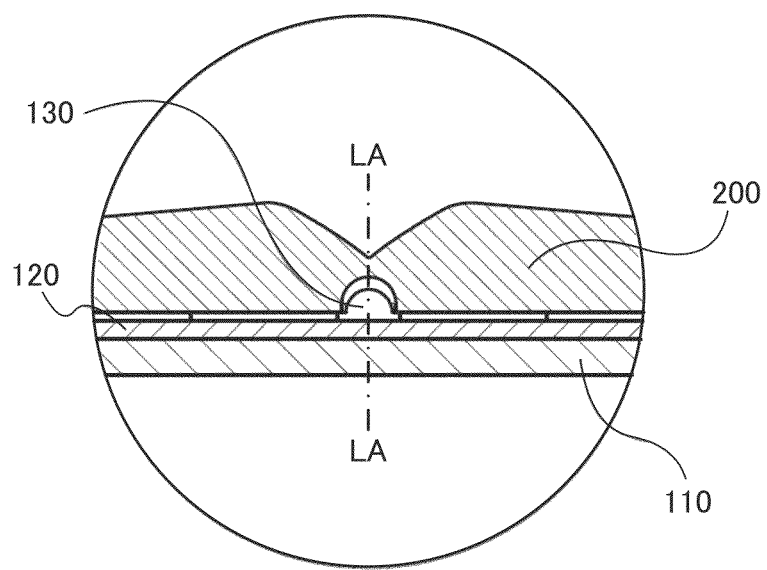
FIG. 2C is a partially enlarged sectional view of a region surrounded by a broken line in FIG. 2A.

FIGS. 1A to 2C illustrate a configuration of illumination apparatus 100 of Embodiment 1 of the present invention. FIG. 1A is a plan view of illumination apparatus 100, FIG. 1B is a front view of illumination apparatus 100, and FIG. 1C is a side view of illumination apparatus 100. FIG. 2A is a sectional view taken along line A-A of FIG. 1A, FIG. 2B is a sectional view taken along line B-B of FIG. 2A, and FIG. 2C is a partially enlarged sectional view of a region surrounded by a broken line in FIG. 2A.

As illustrated in FIGS. 1A to 2C, illumination apparatus 100 includes frame (housing) 110, substrate 120, a plurality of light emitting elements 130, a plurality of light flux controlling members 200 and cover 140. A pair of light emitting element 130 and light flux controlling member 200 functions as a light-emitting device. In the example illustrated in FIGS. 1A to 2C, illumination apparatus 100 includes three light-emitting devices.

Light emitting elements 130 are a light source of illumination apparatus 100, which are disposed in a line on substrate 120 attached on frame 110 (see FIG. 2C). In the example illustrated in FIG. 2A, three light emitting elements 130 are disposed in a line on substrate 120. Each light emitting element 130 is disposed at a position that faces incidence surface 210 (described later) of light flux controlling member 200. Light emitting element 130 is, for example, a light-emitting diode (LED) such as a white light-emitting diode. Frame 110 and substrate 120 are made of, for example, a metal having a high thermal conductivity such as aluminum and copper. When substrate 120 is not need to have high thermal conductivity, substrate 120 may be composed of a resin substrate having glass nonwoven fabric impregnated with epoxy resin.

Light flux controlling members 200 are disposed in a line on substrate 120 such that light flux controlling members 200 are paired with respective light emitting elements 130 (see FIG. 2A). Light flux controlling member 200 controls the distribution of light emitted from light emitting element 130. Light flux controlling member 200 is formed by integral molding. The material of light flux controlling member 200 is not particularly limited as long as light having a desired wavelength can pass therethrough. Examples of the material of light flux controlling member 200 include: light transmissive resins such as polymethylmethacrylate (PMMA), polycarbonate (PC), and epoxy resin (EP); or light transmissive glass. In addition, a light diffusing member such as beads may be dispersed in light flux controlling member 200.

Illumination apparatus 100 of the present invention has the main feature in the form of light flux controlling member 200.

Therefore, the form of light flux controlling member 200 will be described in detail separately.

By cover 140, the light emitted from light flux controlling member 200 is transmitted to the outside while being diffused. Cover 140 is disposed in such a manner as to cover all light-emitting devices (light emitting element 130 and light flux controlling member 200) with an air layer interposed between each light-emitting device and cover 140. The external surface of cover 140 serves as an effective light emission region.

The shape of cover 140 is not particularly limited as long as it can cover the light-emitting devices, with the air layer interposed between each light-emitting device and the cover 140. While cover 140 has a cylindrical form that is partially cut out in the example illustrated in FIG. 2B, cover 140 may have a cylindrical form.

The material of cover 140 is not particularly limited as long as the material has light transmissivity. Examples of the material of cover 140 include light transmissive resins such as polymethylmethacrylate (PMMA), polycarbonate (PC), polystyrene (PS), and styrene methyl methacrylate copolymerization resin (MS), and light transmissive glasses. In addition, the method for providing cover 140 with a light diffusing function is not particularly limited. For example, a light diffusing treatment (for example, roughening treatment) may be performed on the internal surface or external surface of cover 140, or a diffusing member such as beads may be dispersed in the light transmissive resins.

(Form of Light Flux Controlling Member)

FIGS. 3A to 3G illustrate a configuration of light flux controlling member 200 of Embodiment 1 of the present invention. FIG. 3A is a front view of light flux controlling member 200, FIG. 3B is a plan view of light flux controlling member 200, FIG. 3C is a bottom view of light flux controlling member 200, FIG. 3D is a side view of light flux controlling member 200, FIG. 3E is a sectional view taken along line C-C of FIG. 3B, FIG. 3F is a sectional view taken along line D-D of FIG. 3B, and FIG. 3G is a sectional view taken along line E-E of FIG. 3B.

As illustrated in FIGS. 3A to 3G, light flux controlling member 200 includes: incidence surface 210 on which light emitted from light emitting element 130 is incident; total reflection surface 220 configured to reflect part of light incident on incidence surface 210 in a predetermined direction; two light guiding sections 230 configured to guide the part of light incident on incidence surface 210 and light reflected by total reflection surface 220; and two emission surfaces 240 configured to output light that travels in light guiding section 230 and is incident on the inside at an angle not larger than a critical angle.

On incidence surface 210, light emitted from light emitting element 130 is incident. Light emitting element 130 is a dot light source such as an LED. Incidence surface 210 is an internal surface of recess 250 that is formed at a center portion of the bottom surface (the surface located on light emitting element 130 side) of light flux controlling member 200. In the example illustrated in FIGS. 3A to 3G, recess 250 has a hemispherical form or a hemiellipsoidal form, and incidence surface 210 is composed of an edgeless curved surface. While the form of incidence surface 210 is not particularly limited, an edgeless curved surface is preferable as described later with reference to FIGS. 5A to 6B.

Total reflection surface 220 is formed at a position that faces light emitting element 130 with incidence surface 210 therebetween, and is formed plane-symmetrically about a virtual plane which is perpendicular to substrate 120 and includes optical axis LA (see FIG. 2C) of the light emitting element. Total reflection surface 220 reflects part of light incident on incidence surface 210 in opposite two directions (the directions of two light guiding sections 230) which are substantially perpendicular to optical axis LA of the light emitting element and the virtual plane. That is, total reflection surface 220 reflects light that reaches total reflection surface 220 toward two light guiding sections 230. It is to be noted that, as used herein, "optical axis of light emitting element" is the travelling direction of light at the center of a stereoscopic light flux from the light emitting element. In addition, total reflection surface 220 is designed for light emitted from a center portion on the light emitting surface of light emitting element 130.

Figure 4A:
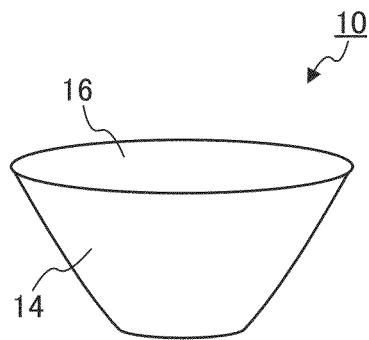
FIGS. 4A to 4E are drawings for describing a form of a total reflection surface.
Figure 4B:
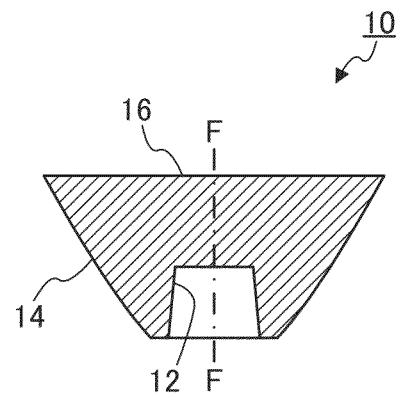

With reference to FIGS. 4A to 4E, the form of total reflection surface 220 will be described. FIG. 4A and FIG. 4B illustrate a configuration of light flux controlling member 10 that includes a light emitting element as a light source and is used for a spotlight. FIG. 4A is a perspective view of light flux controlling member 10, and FIG. 4B is a sectional view of light flux controlling member 10. As illustrated in FIG. 4A and FIG. 4B, light flux controlling member 10 includes: incidence surface 12 on which light emitted from light emitting element is incident; total reflection surface 14 that totally reflects part of light incident on incidence surface 12; and emission surface 16 from which light part of light incident on incidence surface 12 and light reflected by total reflection surface 14 are emitted. Incidence surface 12 is an internal surface of a truncated cone shaped recess that is formed at a bottom of light flux controlling member 10. Total reflection surface 14 is a surface extending from the outer edge of the bottom of light flux controlling member 10 to the outer edge of emission surface 16, and is a rotationally symmetrical surface formed in such a manner as to surround the central axis of light flux controlling member 10. The diameter of total reflection surface 14 gradually increases from incidence surface 12 side (bottom side) toward emission surface 16 side. The generatrix of total reflection surface 14 is an arc-like curve protruding outward. Emission surface 16 is a planar surface located at a position opposite to incidence surface 12 (bottom) in light flux controlling member 10.

Figure 4C:
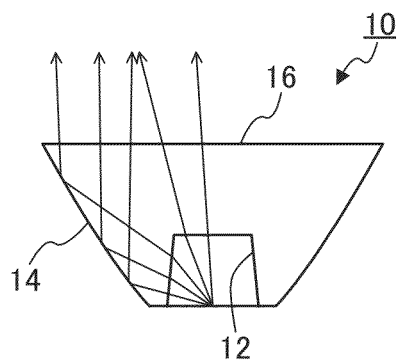

FIG. 4C illustrates light paths in the case where light flux controlling member 10 is used. As illustrated in FIG. 4C, light emitted from a dot light source disposed at a predetermined position enters light flux controlling member 10 from incidence surface 12. Part of light having entered light flux controlling member 10 is output from emission surface 16 without being reflected by total reflection surface 14. The remaining part of the light having entered light flux controlling member 10 is reflected by total reflection surface 14 toward emission surface 16, and output from emission surface 16. In this manner, the distribution of light emitted from the dot light source is controlled and the light is output from emission surface 16.

Figure 4D:
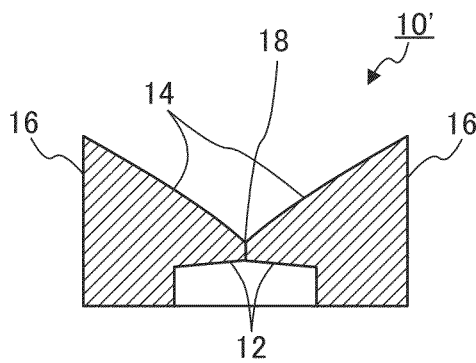
Figure 4E:
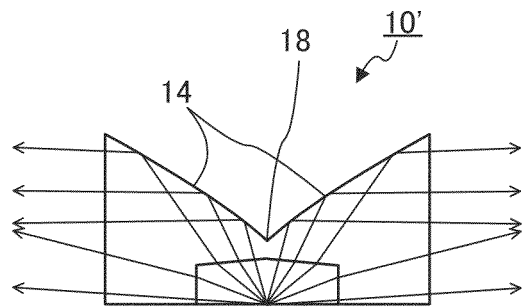

When light flux controlling member 10 is divided into two parts along line F-F of FIG. 4B and the bottoms of the two parts are connected, light flux controlling member 10' illustrated in FIG. 4D is obtained. As illustrated in FIG. 4E, in light flux controlling member 10' thus obtained, light emitted from the dot light source is reflected by two total reflection surfaces 14 and becomes two beams of light travelling in opposite directions. The form of total reflection surface 220 of light flux controlling member 200 of the present embodiment is basically the same as the form of total reflection surface 14 of light flux controlling member 10' illustrated in FIG. 4D. In the following description, the portion denoted by the reference sign "18" in the proximity of the boundary line of two total reflection surfaces 14 in FIG. 4D and FIG. 4E is sometimes referred to as "connecting section of total reflection surface."

Two light guiding sections 230 are rod-like members formed (plane-symmetrically about the virtual plane which includes optical axis LA of the light emitting element and is perpendicular to substrate 120) at opposing positions with incidence surface 210 and total reflection surface 220 therebetween. Two light guiding sections 230 are each connected to emission surface 16 of light flux controlling member 10' illustrated in FIG. 4D. Light guiding section 230 guide part of light incident on incidence surface 210 and light reflected by total reflection surface 220 in the direction away from incidence surface 210 and total reflection surface 220, while outputting the part of light incident on incidence surface 210 and the light reflected by total reflection surface 220 little by little. Thus, the external surface of light guiding section 230 functions as emission surface 240 that outputs light guided by light guiding section 230.

Light guiding section 230 totally reflects the incident light on the surface of light guiding section 230, thereby guiding the incident light in a direction away from incidence surface 210 and total reflection surface 220. Meanwhile, light guiding section 230 outputs the incident light from the surface of light guiding section 230 (emission surface 240). In order to achieve both the guiding and outputting, light guiding section 230 is so formed that its cross-sectional area decreases as the distance from incidence surface 210 and total reflection surface 220 increases. While the cross-sectional area of light guiding section 230 is controlled by adjusting both the thickness and width in the example illustrated in FIGS. 3A to 3G, the cross-sectional area of light guiding section 230 may be controlled by adjusting either of the thickness or width. The cross-sectional form of light guiding section 230 in the minor axis direction is not particularly limited, and may be appropriately selected in accordance with the desired light distribution. In the example illustrated in FIGS. 3A to 3G, the cross-sectional form of light guiding section 230 in the minor axis direction is a semicircular form. In light flux controlling member 200 of Embodiment 1, the entirety of light guiding section 230 is formed as a cross-sectional area changing section.

In view of uniformizing the amount of light emitted from emission surface 240, a diffusing member such as beads is preferably dispersed in light guiding section 230. In addition, a light diffusing treatment (for example, roughening process) may be performed on emission surface 240.

Figure 5A:
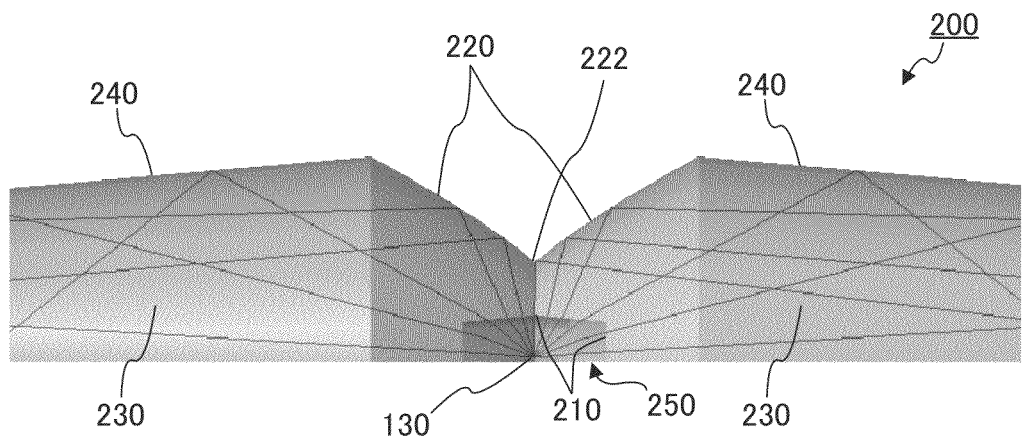
FIG. 5A is a schematic view (front view) illustrating light paths in the light flux controlling member of Embodiment 1.
Figure 5B:
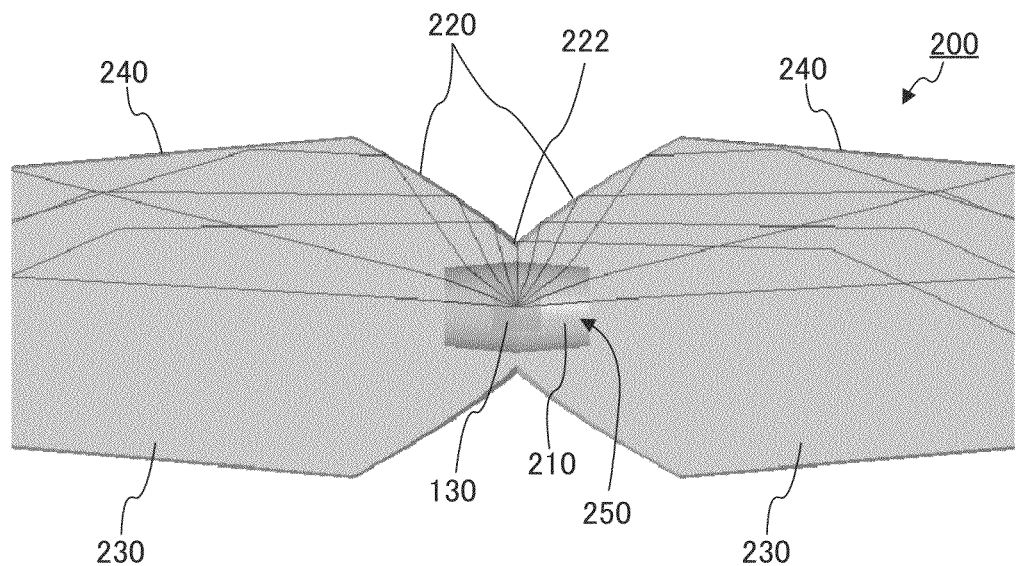
FIG. 5B is a schematic view (bottom view) illustrating light paths in the light flux controlling member of Embodiment 1.
Figure 6A:
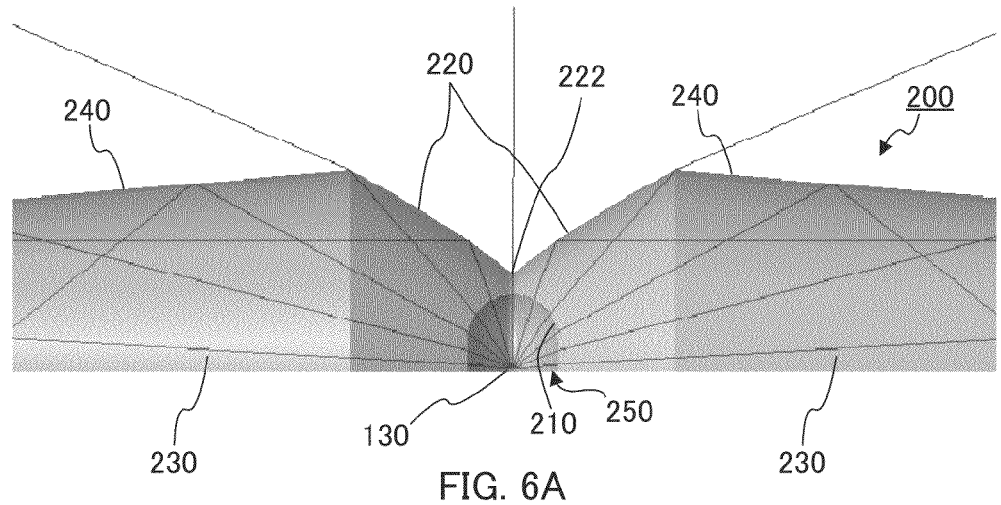
FIG. 6A is a schematic view (front view) illustrating light paths in the light flux controlling member of Embodiment 1.
Figure 6B:
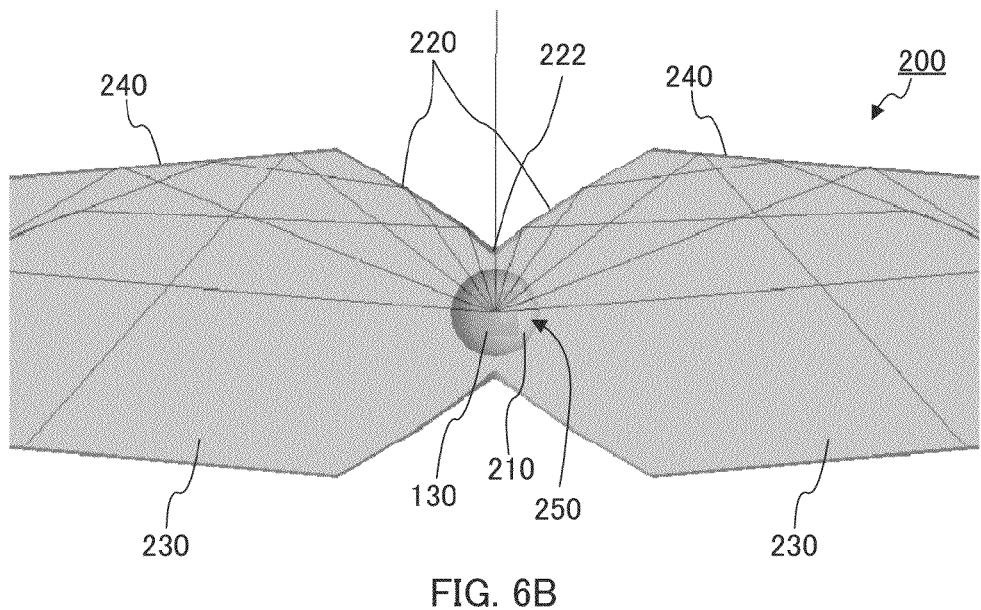
FIG. 6B is a schematic view (bottom view) illustrating light paths in the light flux controlling member of Embodiment 1.

FIGS. 5A to 6B are schematic views illustrating light paths in light flux controlling member 200 in the region illustrated in FIG. 2C. FIGS. 5A and 5B illustrate light paths in the case where incidence surface 210 includes an edge (when recess 250 has a form which is obtained by connecting two half truncated cones; see FIG. 4D), and FIGS. 6A and 6B illustrate light paths in the case where incidence surface 210 has no edge (when recess 250 has a substantially hemispherical form). In addition, while connecting section 222 of the total reflection surface is not chamfered in light flux controlling member 200 illustrated in FIGS. 5A and 5B, connecting section 222 of the total reflection surface is chamfered into a round form in light flux controlling member 200 illustrated in FIGS. 6A and 6B. It is to be noted that FIG. 5A and FIG. 6A are front views, and FIG. 5B and FIG. 6B are bottom views. In FIGS. 5A to 6B, light flux controlling member 200 produced by using a light transmissive resin containing no diffusing member is simulated.

As illustrated in FIGS. 5A to 6B, light emitted from light emitting element 130 enters light flux controlling member 200 from incidence surface 210. Part of light having entered light flux controlling member 200 (light emitted at a large angle with respect to optical axis LA of light emitting element 130) directly reaches light guiding section 230 without being reflected by total reflection surface 220. On the other hand, part of light having entered light flux controlling member 200 (light emitted at a small angle with respect to optical axis LA of light emitting element 130) is reflected by total reflection surface 220 toward light guiding section 230. As a result, upward light (in the direction of optical axis LA of light emitting element 130) emitted from light emitting element 130 becomes light directed in the lateral direction (in substantially the vertical direction with respect to optical axis LA of light emitting element 130), and is incident on either of two light guiding sections 230. Light incident on light guiding section 230 is guided toward the end portion of light guiding section 230 while being output little by little from emission surface 240. As a result, light is substantially uniformly output from the entirety of the external surface of light guiding section 230 (the entirety of emission surface 240). Light emitted from emission surface 240 of light flux controlling member 200 is transmitted through the air layer and reaches the internal surface of cover 140. The light having reached the internal surface of cover 140 is transmitted through cover 140 while being diffused. As a result, the light is substantially uniformly emitted from the entirety of the exterior surface of cover 140. In this manner, light emitted from light emitting element 130 that is a dot light source can be converted to linear light by light flux controlling member 200.

As illustrated in FIGS. 5A and 5B, when incidence surface 210 includes an edge and connecting section 222 of the total reflection surface is not chamfered, most of the light having entered from incidence surface 210 and reached total reflection surface 220 is reflected toward light guiding section 230. Therefore, when light flux controlling member 200 illustrated in FIGS. 5A and 5B is used, the region around total reflection surface 220 may be darkened. On the other hand, when incidence surface 210 has no edge and connecting section 222 of the total reflection surface is chamfered as illustrated in 6A and 6B, part of light having entered from incidence surface 210 and reached total reflection surface 220 is not reflected by total reflection surface 220, and is output from total reflection surface 220. Therefore, in order to prevent the region around total reflection surface 220 from being darkened, the form of incidence surface 210 is preferably an edgeless form, and connecting section 222 of the total reflection surface is preferably chamfered.

(Simulation of Illuminance Distribution of Illumination Apparatus)

The illuminance distribution of illumination apparatus 100 of Embodiment 1 illustrated in FIGS. 1A to 2C was simulated.

Three light emitting elements 130 (white LEDs) are disposed on substrate 120 in a line with a center-to-center distance of 100 mm therebetween, and light flux controlling member 200 having a length of 100 mm is disposed on each light emitting element 130.

Three light flux controlling members 200 are disposed such that their major axes are aligned along one line. The total length of illumination apparatus 100 is 330 mm, and the outer diameter of cover 140 is 26 mm.

Figure 7:
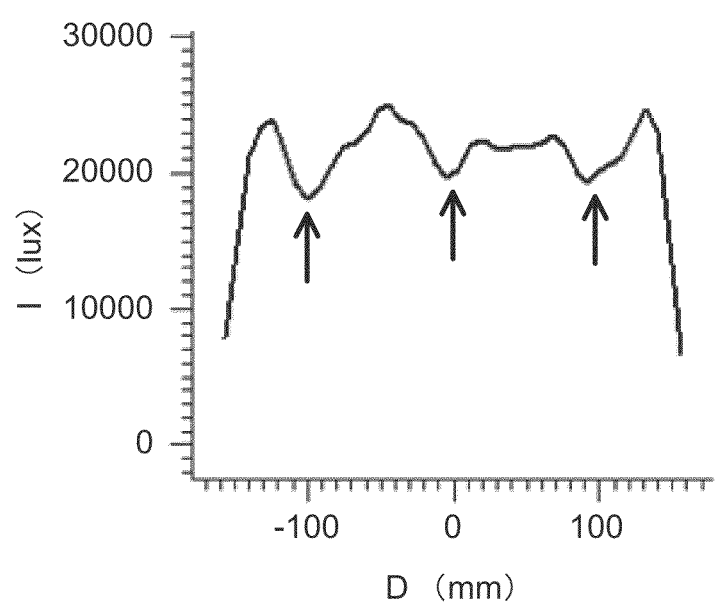
FIG. 7 is a graph illustrating results of a simulation of an illuminance distribution of a front surface of the illumination apparatus of Embodiment 1.

FIG. 7 is a graph illustrating results of a simulation of the illuminance distribution in the case where illumination apparatus 100 is observed from the front (observed as in FIG. 1B). The abscissa represents the position of illumination apparatus 100 in the major axis direction (D; mm), and the center point where light emitting element 130 is disposed is "0." The ordinate represents the illuminance (I; lux) at each point on the external surface (exterior surface) of cover 140. That is, FIG. 7 illustrates the brightness distribution of illumination apparatus 100 itself. The arrows represent the positions of light emitting elements 130.

As illustrated in FIG. 7, although only three light emitting elements 130 are provided in illumination apparatus 100 of Embodiment 1, the luminance unevenness was small. These results indicate that light flux controlling member 200 of Embodiment 1 can appropriately control the distribution of light emitted from light emitting element 130.

(Effect)

Illumination apparatus 100 of Embodiment 1 can substantially uniformly irradiate cover 140 with light with a small number of light emitting elements 130, and therefore can achieve high energy efficiency and small luminance unevenness.

[Embodiment 2]

(Configuration of Illumination Apparatus)

Figure 8A:
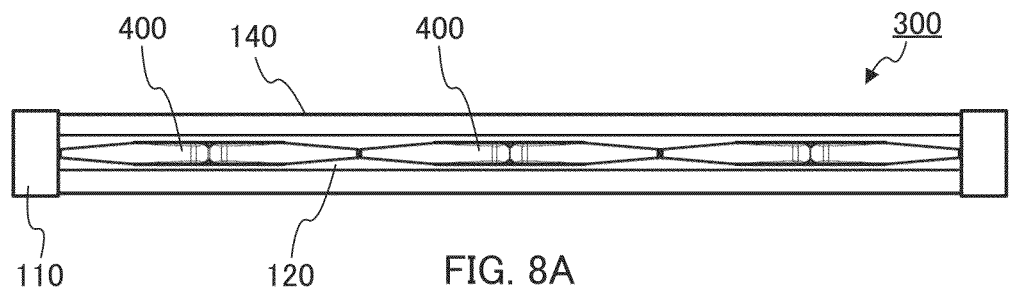
FIG. 8A is a plan view of an illumination apparatus of Embodiment 2 in which a part of a cover is removed.
Figure 8B:
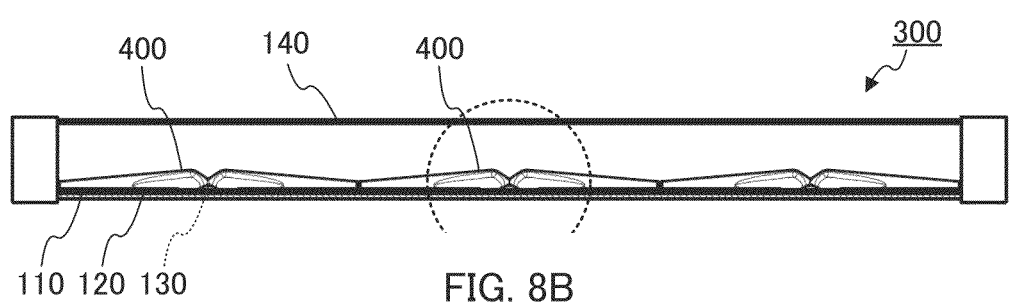
FIG. 8B is front view of the illumination apparatus of Embodiment 2 in which a part of the cover is removed.
Figure 8C:
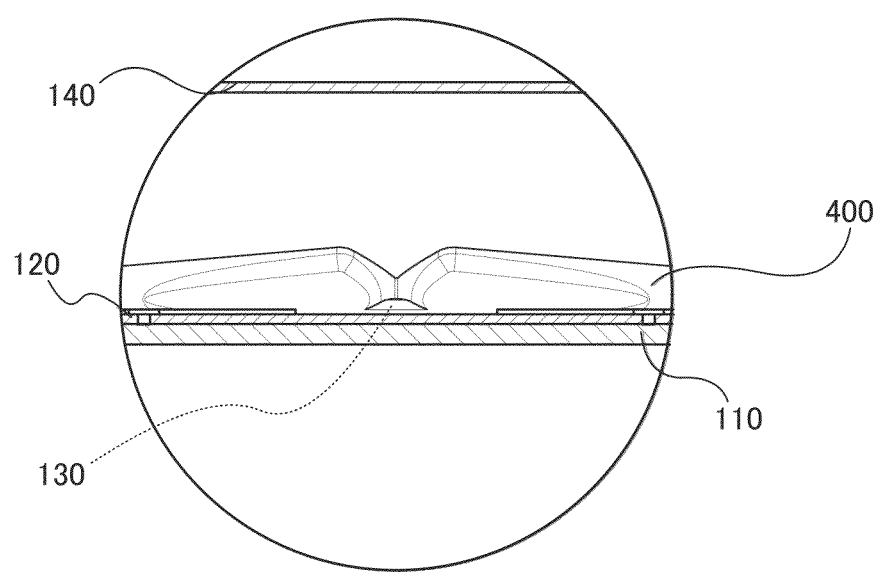
FIG. 8C is an enlarged view of a region surrounded by a broken line in FIG. 8B.

FIGS. 8A to 8C are partial sectional views illustrating a configuration of illumination apparatus 300 of Embodiment 2 of the present invention. FIG. 8A is a plan view of illumination apparatus 300 in which a part of cover 140 is removed, FIG. 8B is a front view of illumination apparatus 300 in which a part of cover 140 is removed so that the inside thereof can be observed, and FIG. 8C is an enlarged view of a region surrounded by a broken line in FIG. 8B.

As illustrated in FIGS. 8A to 8C, illumination apparatus 300 includes frame 110, substrate 120, a plurality of light emitting elements 130, a plurality of light flux controlling members 400 and cover 140. A pair of light emitting element 130 and light flux controlling member 400 functions as a light-emitting device. Illumination apparatus 300 of Embodiment 2 is different from illumination apparatus 100 of Embodiment 1 in the form of light flux controlling member 400. Here, the same components as those of illumination apparatus 100 of Embodiment 1 are denoted by the same reference numerals, and the descriptions thereof are omitted.

(Form of Light Flux Controlling Member)

Figure 9A:
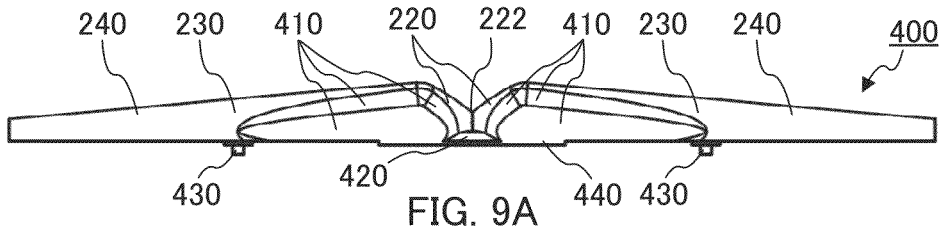
FIG. 9A is a front view of a light flux controlling member of Embodiment 2.
Figure 9B:
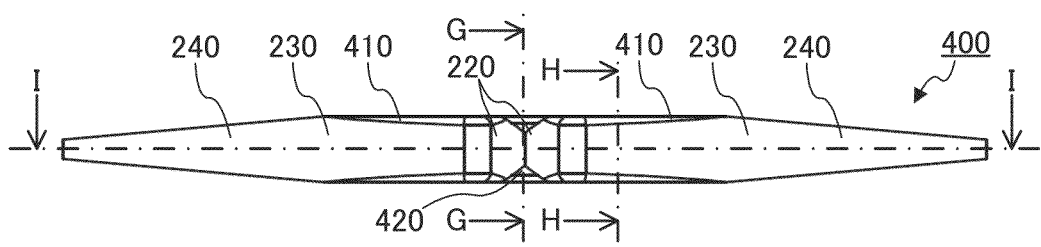
FIG. 9B is a plan view of the light flux controlling member of Embodiment 2.
Figure 9C:
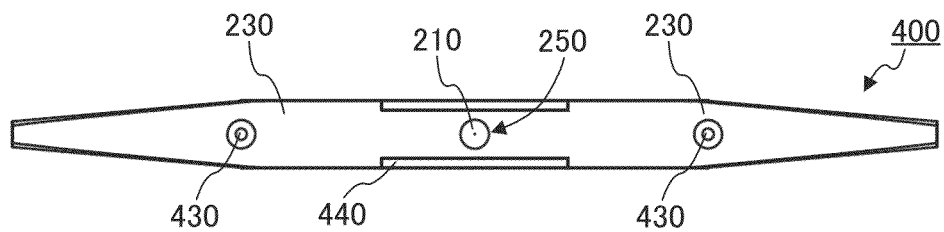
FIG. 9C is a bottom view of the light flux controlling member of Embodiment 2.
Figure 9D:
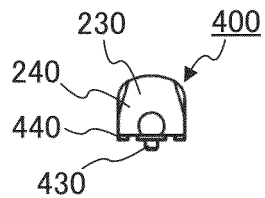
FIG. 9D is a side view of the light flux controlling member of Embodiment 2.
Figure 9E:
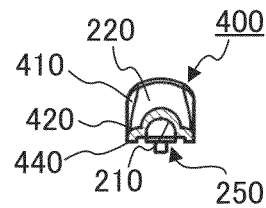
FIG. 9E is a sectional view taken along line G-G of FIG. 9B.
Figure 9F:
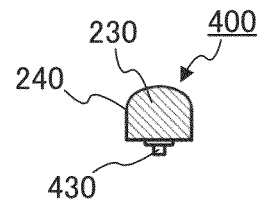
FIG. 9F is a sectional view taken along line H-H of FIG. 9B.
Figure 9G:
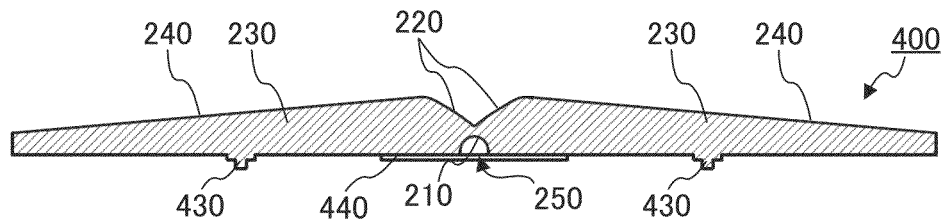
FIG. 9G is a sectional view taken along line I-I of FIG. 9B.

FIGS. 9A to 9G illustrate a configuration of light flux controlling member 400 of Embodiment 2 of the present invention. FIG. 9A is a front view of light flux controlling member 400, FIG. 9B is a plan view of light flux controlling member 400, FIG. 9C is a bottom view of light flux controlling member 400, FIG. 9D is a side view of light flux controlling member 400, FIG. 9E is a sectional view taken along line G-G of FIG. 9B, FIG. 9F is a sectional view taken along line H-H of FIG. 9B, and FIG. 9G is a sectional view taken along line I-I of FIG. 9B.

Light flux controlling member 400 of Embodiment 2 has a form which is obtained by cutting out a part of the side surface around the center portion of light flux controlling member 200 of Embodiment 1. Thus, light flux controlling member 400 of Embodiment 2 includes additional emission surface 410 at a location around the center portion of the side surface. In addition, light flux controlling member 400 of Embodiment 2 includes additional emission surface 420 having a substantially cylindrical form at a center portion on a lower side of the side surface. Therefore, in light flux controlling member 400 of Embodiment 2, the area of total reflection surface 220 is small in comparison with light flux controlling member 200 of Embodiment 1.

By additional emission surfaces 410 and 420, part of light incident on incidence surface 210 is output from the region around total reflection surface 220. Thus, in light flux controlling member 400 of Embodiment 2, the amount of light output from the region around total reflection surface 220 is large in comparison with light flux controlling member 200 of Embodiment 1.

In addition, light flux controlling member 400 of Embodiment 2 includes two legs 430 for fixing light flux controlling member 400 to substrate 120, and two reinforcement plates 440 for increasing the strength of light flux controlling member 400.

Figure 10A:
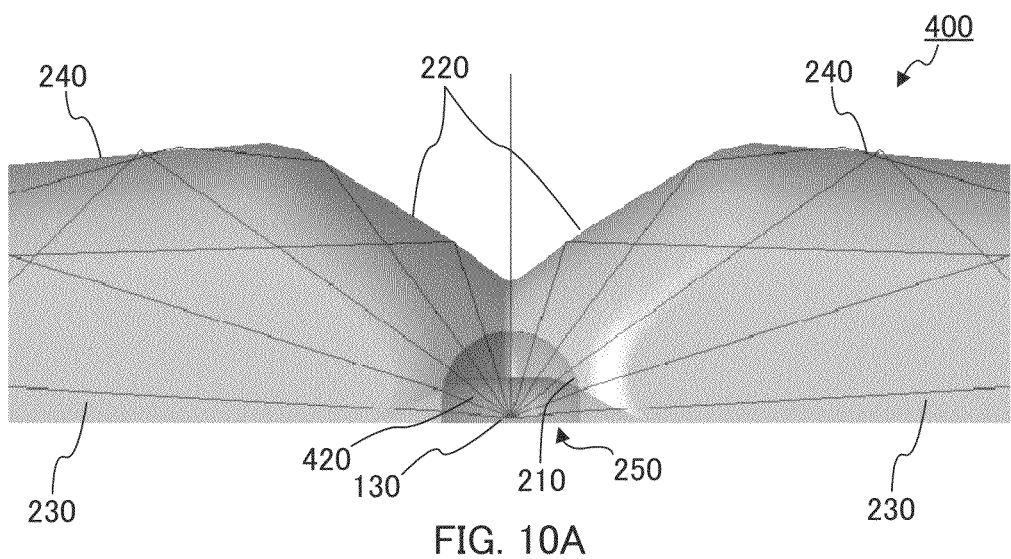
FIG. 10A is a schematic view (front view) illustrating the light paths in the light flux controlling member of Embodiment 2.
Figure 10B:
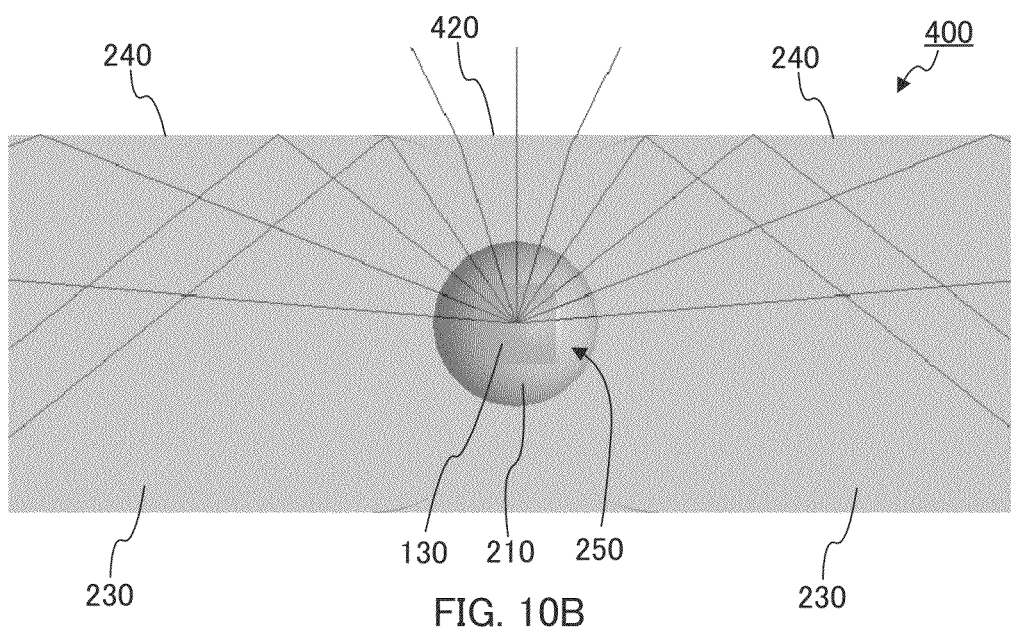
FIG. 10B is a schematic view (bottom view) illustrating the light paths in the light flux controlling member of Embodiment 2.

FIGS. 10A and 10B are schematic views illustrating light paths in light flux controlling member 400 in the region illustrated in FIG. 8C. FIG. 10A is a front view, and FIG. 10B is a bottom view.

As illustrated in FIGS. 10A and 10B, light emitted from light emitting element 130 enters light flux controlling member 400 from incidence surface 210. Part of light having entered light flux controlling member 400 (light emitted at a large angle with respect to optical axis LA of light emitting element 130) directly reaches light guiding section 230 without being reflected by total reflection surface 220, or is output from emission surfaces 410 and 420 as it is. On the other hand, part of light having entered light flux controlling member 400 (light emitted at a small angle with respect to optical axis LA of light emitting element 130) is reflected by total reflection surface 220 toward light guiding section 230. Light having entered guiding section 230 is output from emission surface 410 as it is, or guided toward the end portion of light guiding section 230 while being output from emission surface 240 little by little. As a result, the light is substantially uniformly emitted from the entirety of the exterior surface (emission surfaces 240 and 410) of light guiding section 230. Light emitted from emission surface 240 of light flux controlling member 200 is transmitted through the air layer and reaches the internal surface of cover 140. The light having reached the internal surface of cover 140 is transmitted through cover 140 while being diffused. As a result, the light is substantially uniformly emitted from the entirety of the exterior surface of cover 140.

As illustrated in FIGS. 10A and 10B, in light flux controlling member 400 of Embodiment 2, part of light incident on incidence surface 210 does not reach total reflection surface 220 and is not guided in light guiding section 230, but is output from emission surfaces 410 and 420 located in the vicinity of total reflection surface 220. Thus, in light flux controlling member 400 of Embodiment 2, the amount of light emitted from the region around total reflection surface 220 is great in comparison with light flux controlling member 200 of Embodiment 1.

(Simulation of Illuminance Distribution of Illumination Apparatus)

Figure 11:
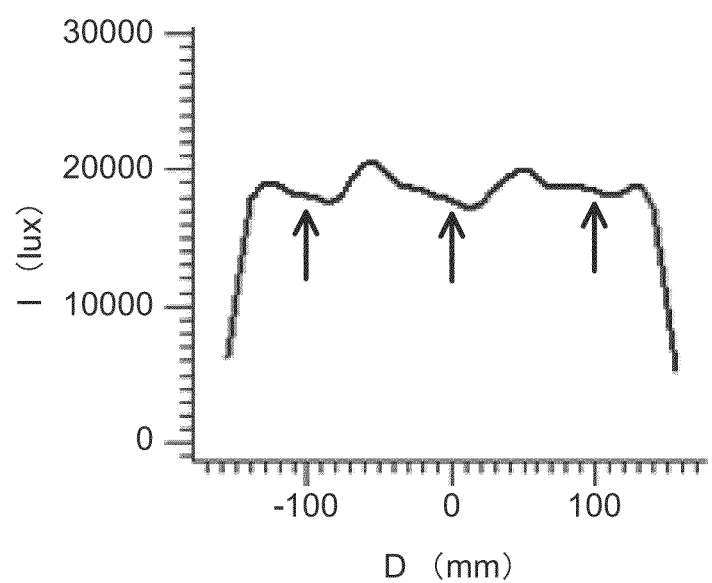
FIG. 11 is a graph illustrating results of a simulation of an illuminance distribution of a front surface of the illumination apparatus of Embodiment 2.

The illuminance distribution of illumination apparatus 300 of Embodiment 2 illustrated in FIGS. 8A to 8C was simulated. FIG. 11 is a graph illustrating results of a simulation of the illuminance distribution in the case where illumination apparatus 300 is observed from the front (observed as in FIG. 8B). The abscissa represents the position of illumination apparatus 300 in the major axis direction (D; mm), and the center point where light emitting element 130 is disposed is "0." The ordinate represents the illuminance (I; lux) at each point on the external surface (exterior surface) of cover 140.

As illustrated by arrows in FIG. 7, in illumination apparatus 100 of Embodiment 1, slight decrease in illuminance was caused at the positions of light emitting elements 130. This is because almost no light is emitted from the region around total reflection surface 220. In contrast, since light is emitted also from the region around total reflection surface 220 in illumination apparatus 300 of Embodiment 2, the amount of decrease in illuminance was only small even at the positions of light emitting elements 130 as illustrated in FIG. 11.

(Effect)

In addition to the effect of illumination apparatus 100 of Embodiment 1, illumination apparatus 300 of Embodiment 2 has an effect in which luminance unevenness in the effective light emission region can be limited, since the amount of light emitted from the region around total reflection surface 220 is great.

[Embodiment 3]

(Configuration of Illumination Apparatus)

Figure 12A:
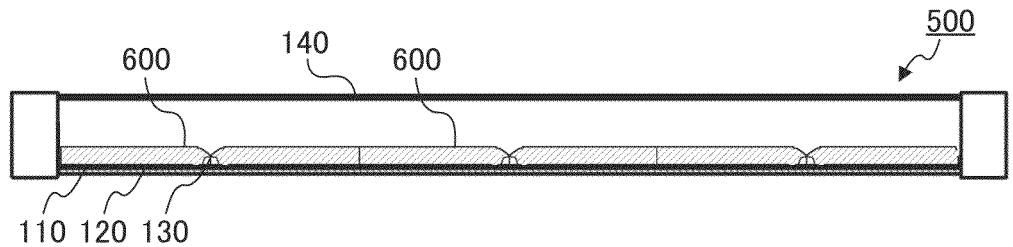
FIG. 12A is a front view of an illumination apparatus of Embodiment 3 in which a part of a cover is removed.
Figure 12B:
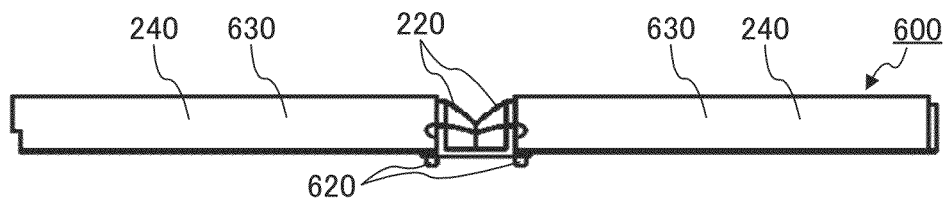
FIG. 12B is a front view of a light flux controlling member of Embodiment 3.
Figure 12C:
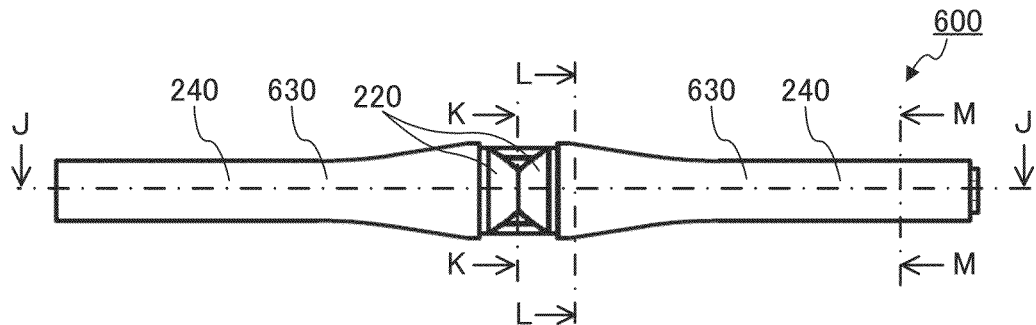
FIG. 12C is a plan view of the light flux controlling member of Embodiment 3.
Figure 12D:
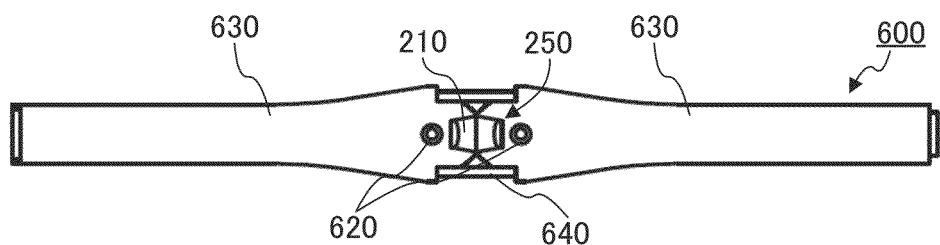
FIG. 12D is a bottom view of the light flux controlling member of Embodiment 3.
Figure 12E:
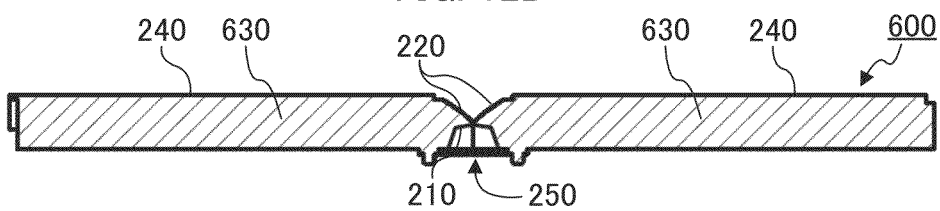
FIG. 12E is a sectional view taken along line J-J of FIG. 12C.
Figures 13A, 13B:
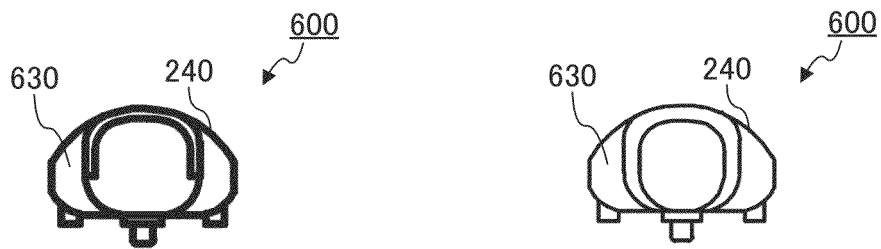
FIG. 13A is a left side view of the light flux controlling member of Embodiment 3.
FIG. 13B is a right side view of the light flux controlling member of Embodiment 3.
Figures 13C, 13D:
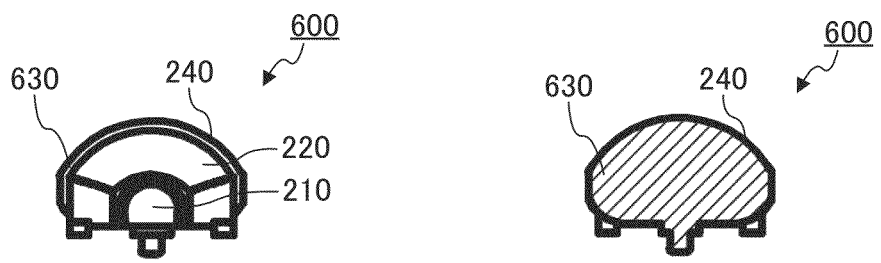
FIG. 13C is a sectional view taken along line K-K of FIG. 12C.
FIG. 13D is a sectional view taken along line L-L of FIG. 12C.
Figure 13E:
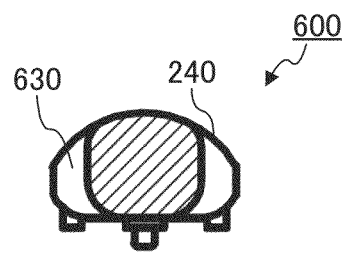
FIG. 13E is a sectional view taken along line M-M of FIG. 12C.

FIGS. 12A to 13E illustrate a configuration of illumination apparatus 500 and light flux controlling member 600 of Embodiment 3. FIG. 12A is a front view of illumination apparatus 500 in which a part of cover 140 is removed so that the inside thereof can be observed, FIG. 12B is a front view of light flux controlling member 600, FIG. 12C is a plan view of light flux controlling member 600, FIG. 12D is a bottom view of light flux controlling member 600, and FIG. 12E is a sectional view taken along line J-J of FIG. 12C. FIG. 13A is a left side view of light flux controlling member 600, FIG. 13B is a right side view of light flux controlling member 600, FIG. 13C is a sectional view taken along line K-K of FIG. 12C, FIG. 13D is a sectional view taken along line L-L of FIG. 12C, and FIG. 13E is a sectional view taken along line M-M of FIG. 12C.

As illustrated in FIG. 12A, illumination apparatus 500 includes frame 110, substrate 120, a plurality of light emitting elements 130, a plurality of light flux controlling members 600 and cover 140. A pair of light emitting element 130 and light flux controlling member 600 functions as a light-emitting device. Illumination apparatus 500 of Embodiment 3 is different from illumination apparatus 100 of Embodiment 1 in the form of light flux controlling member 600. Here, the same components as those of illumination apparatus 100 of Embodiment 1 are denoted by the same reference numerals, and the descriptions thereof are omitted.

(Form of Light Flux Controlling Member)

As illustrated in FIGS. 12B to 13E, light guiding section 630 of light flux controlling member 600 of Embodiment 3 includes a region which is formed at a portion distant from light emitting element 130 (incidence surface 210) and whose cross-sectional area does not change, and a cross-sectional area changing section which is formed on the side nearer to light emitting element 130 (incidence surface 210) and whose cross-sectional area changes. The height of light guiding section 630 from substrate 120 is the same between the portion on the light emitting element 130 side and the portion distant from the light emitting element. In addition, light flux controlling member 600 includes a pair of positioning protrusions 620 and a pair of reinforcement members 640.

Positioning protrusion 620 sets the position of light flux controlling member 600 with respect to substrate 120. Positioning protrusion 620 is formed in a substantially cylindrical form. Positioning protrusion 620 is disposed on the rear surface of light guiding section 630.

Reinforcement member 640 increases the strength of light flux controlling member 600. The position and form of reinforcement member 640 are not particularly limited as long as the function of total reflection surface 220 of light flux controlling member 600 is not significantly blocked and the strength of light flux controlling member 600 can be increased. In the present embodiment, reinforcement member 640 is disposed on the bottom surface of light flux controlling member 600 (surface on light emitting element 130 side), thus joining the end surfaces of light guiding section 630.

In addition, although not illustrated in the drawings, also in light flux controlling member 600 of Embodiment 3, light emitted from light emitting element 130 is controlled as with the case where light flux controlling member 200 of Embodiment 1 is used. It is to be noted that the light component which is output while being not totally reflected by total reflection surface 220 increases as the size of the light emitting surface of light emitting element 130 increases. In such a case, even in a state where incidence surface 210 includes an edge and the entirety of incidence surface 210 is not composed of a curved surface as in the case of light flux controlling member 600, light output from total reflection surface 220 is generated. Therefore, it is only necessary to determine whether to provide an edge such that a bright-dark point with strong contrast which degrades the light emission quality is not caused on cover 140 of illumination apparatus 500, in consideration of the balance between totally reflected light and output light.

(Effect)

Illumination apparatus 500 of Embodiment 3 has the same effect as that of illumination apparatus 100 of Embodiment 1.

[Embodiment 4]

(Configuration of Illumination Apparatus)

Figure 14A:
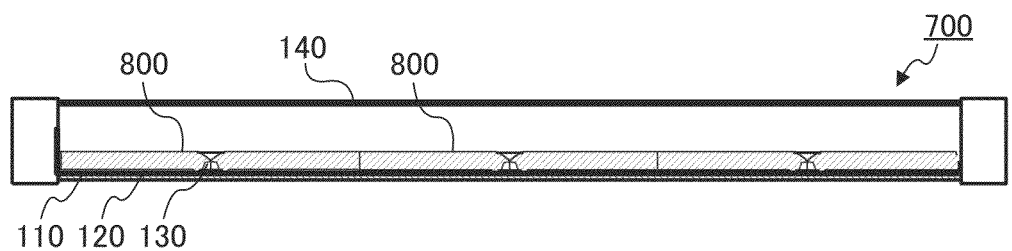
FIG. 14A is a front view of an illumination apparatus of Embodiment 4 in which a part of a cover is removed.
Figure 14B:
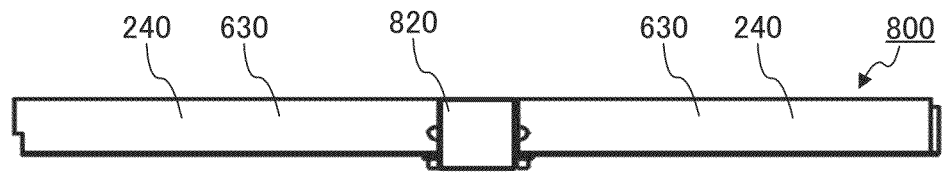
FIG. 14B is a front view of a light flux controlling member of Embodiment 4.
Figure 14C:
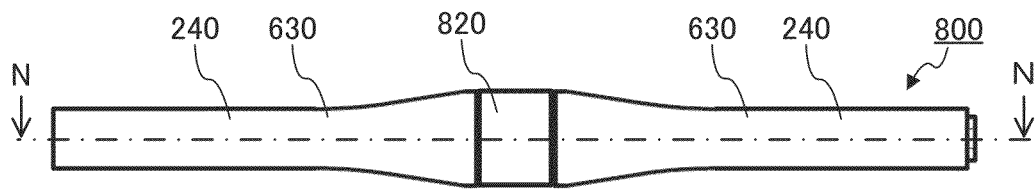
FIG. 14C is a plan view of the light flux controlling member of Embodiment 4.
Figure 14D:
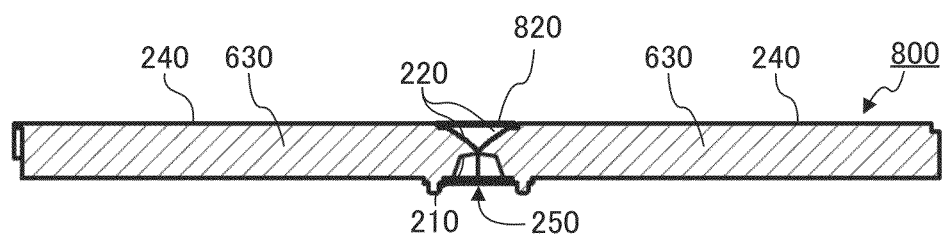
FIG. 14D is a sectional view taken along line N-N of FIG. 14C.
Figure 15A:
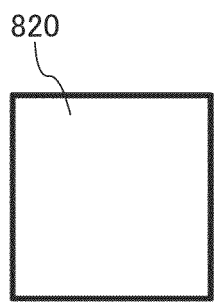
FIG. 15A is a front view of a diffusing member of Embodiment 4.
Figure 15B:
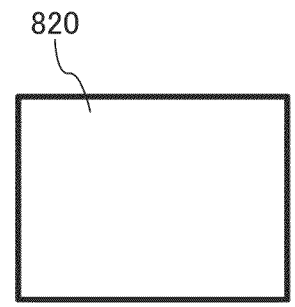
FIG. 15B is a plan view of the diffusing member of Embodiment 4.
Figure 15C:
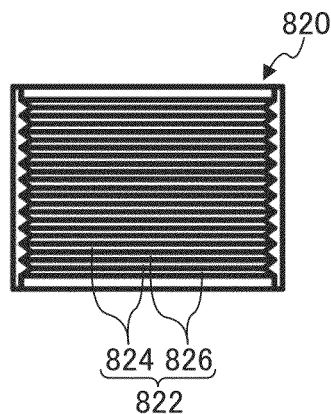
FIG. 15C is a bottom view of the diffusing member of Embodiment 4.
Figure 15D:
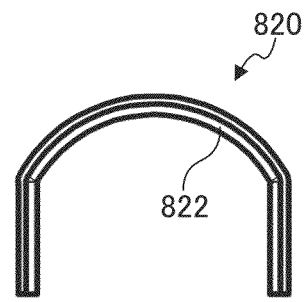
FIG. 15D is a side view of the diffusing member of Embodiment 4.

FIGS. 14A to 15D illustrate configurations of illumination apparatus 700, light flux controlling member 800 and diffusing member 820 of Embodiment 4. FIG. 14A is a front view of illumination apparatus 700 in which a part of cover 140 is removed so that the inside thereof can be observed, FIG. 14B is a front view of light flux controlling member 800, FIG. 14C is a plan view of light flux controlling member 800, and FIG. 14D is a sectional view taken along line N-N of FIG. 14C. FIG. 15A is a front view of diffusing member 820, FIG. 15B is a plan view of diffusing member 820, FIG. 15C is a bottom view of diffusing member 820, and FIG. 15D is a side view of diffusing member 820.

As illustrated in FIG. 14A, illumination apparatus 700 includes frame 110, substrate 120, a plurality of light emitting elements 130, a plurality of light flux controlling members 800 and cover 140. A pair of light emitting element 130 and light flux controlling member 800 functions as a light-emitting device. Illumination apparatus 700 of Embodiment 4 is different from illumination apparatus 700 of Embodiment 3 in the configuration of light flux controlling member 800. Here, the same components as those of illumination apparatus 700 of Embodiment 3 are denoted by the same reference numerals, and the descriptions thereof are omitted.

(Form of Light Flux Controlling Member)

As illustrated in FIGS. 14B to 15D, light flux controlling member 800 of Embodiment 4 includes diffusing member 820 in addition to light flux controlling member 600 (light flux controlling member main body) of Embodiment 3.

As described above, total reflection surface 220 reflects part of light incident on incidence surface 210 in directions in which two light guiding sections 630 extend. In addition, total reflection surface 220 is designed for light emitted from a center portion of the light emitting surface of light emitting element 130. Therefore, part of light emitted from portions other than the center portion of the light emitting surface of light emitting element 130 (for example, outer periphery portions of the light emitting surface) may be output from total reflection surface 220 without being reflected by total reflection surface 220. The light emitted from total reflection surface 220 results in a bright point formed in a region immediately above total reflection surface 220 (light emitting element 130). Consequently, luminance unevenness may be caused in illumination apparatus 700. Diffusing member 820 limits the formation of a bright point at a portion immediately above total reflection surface 220 by diffusing (reflecting or refractively transmitting) the light undesirably output from total reflection surface 220.

As illustrated in FIGS. 15A to 15D, diffusing member 820 is fainted in a substantially half cylindrical form, and includes a plurality of prism rows 822. As used herein, the substantially half cylindrical form may include a half cylinder form, and may have a side wall coupled to a side edge of the half cylinder. That is, diffusing member 820 has a temple-bell-like form (inverted U-form) as viewed in cross-section taken along a direction orthogonal to the axis direction. The axis of diffusing member 820 is, for example, the axis line of the half cylinder portion. Diffusing member 820 may have a half cylindrical form, for example. Diffusing member 820 is disposed in the vicinity of a region immediately above total reflection surface 220. It is to be noted that the position where diffusing member 820 is disposed will be described later.

Prism rows 822 are disposed on the internal surface of diffusing member 820, along a direction orthogonal to the axis direction of diffusing member 820. That is, prism rows 822 are disposed on the internal surface of the half cylinder portion in a semicircular form, and are linearly disposed on the internal surface of the side wall. The cross-sectional form of each prism row 822 is a triangular shape. Each prism row 822 includes first plane 824 and second plane 826. First plane 824 and second plane 826 are alternately and continuously disposed.

Prism rows 822 may have the same form, or different forms. In diffusing member 820 illustrated in FIGS. 15A to 15D, prism rows 822 have the same form. The inclination angles of first inclined surface 824 and second inclined surface 826 with respect to optical axis LA are not particularly limited as long as a bright point can be prevented from being formed in the region immediately above total reflection surface 220 (light emitting element 130).

Figure 16A:
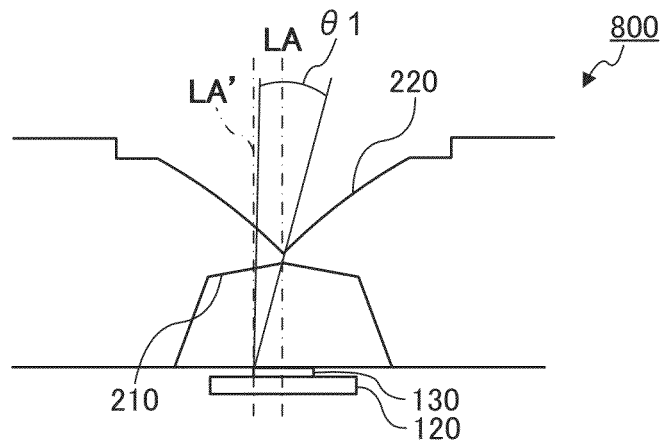
FIG. 16A illustrates an angle, with respect to optical axis, of light emitted from one of an end portion of the light emitting surface and transmitted through a total reflection surface in a cross-section along the major axis direction of light flux controlling member including the optical axis.
Figure 16B:
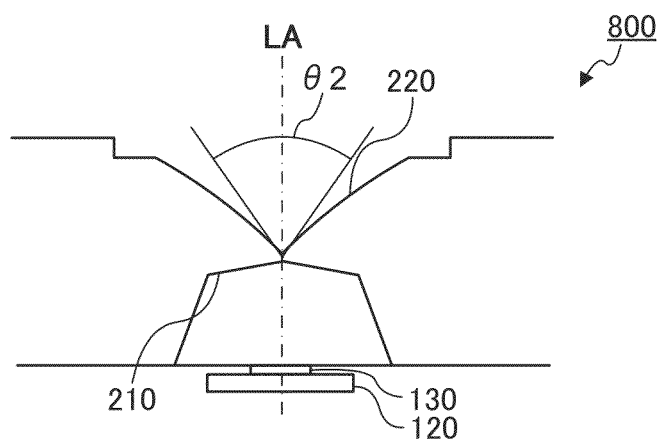
FIG. 16B illustrates an emission range of light emitted from the total reflection surface with respect to the optical axis.
Figure 16C:
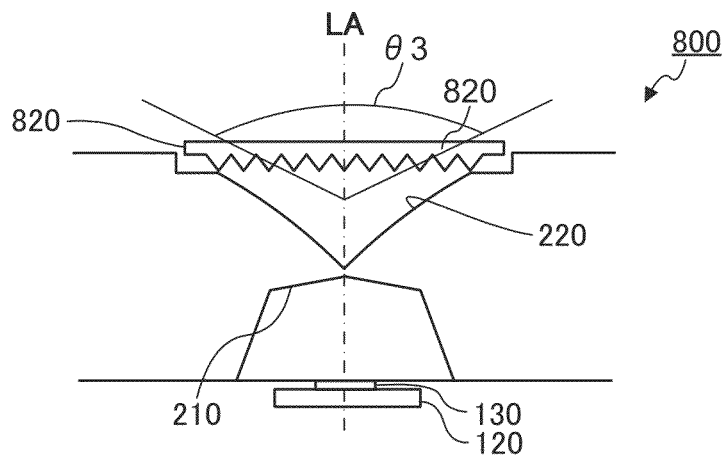
FIG. 16C illustrates an emission range of light emitted from a diffusing member with respect to the optical axis.
Figure 17:
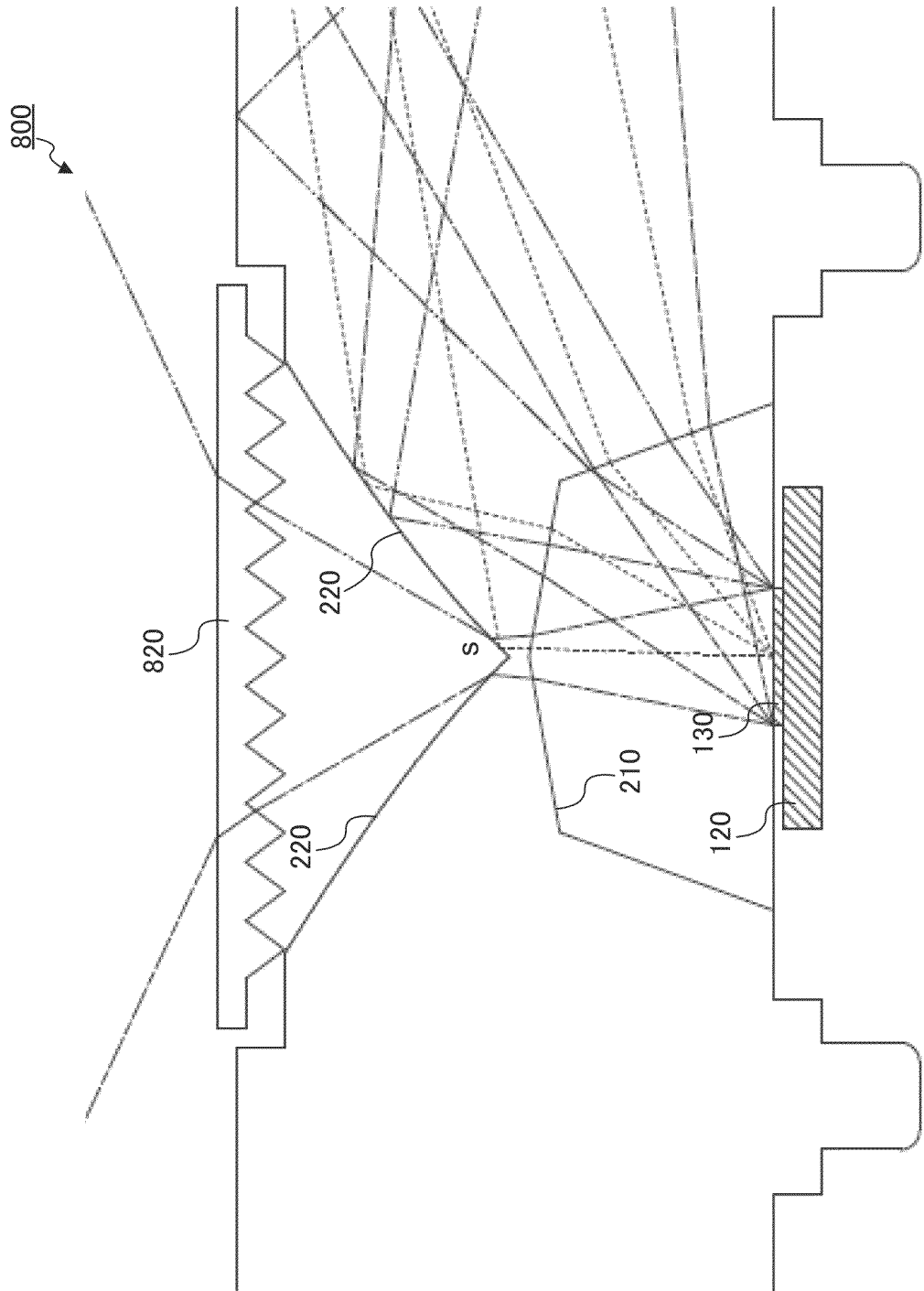
FIG. 17 is a schematic view (sectional view) illustrating light paths in a case where the light flux controlling member of Embodiment 4 is adopted.

FIGS. 16A to 16C are views for describing the position where diffusing member 820 is disposed. FIG. 16A illustrates an emission range (θ1) of light emitted from one end portion of the light emitting surface of light emitting element 130 and transmitted through total reflection surface 220 in a cross-section of light flux controlling member in the major axis direction including optical axis, FIG. 16B illustrates an emission range (θ2) of light emitted from total reflection surface 220, and FIG. 16C illustrates an emission range (θ3) of light controlled by diffusing member 820. FIG. 17 is a sectional view illustrating light paths in the case where light flux controlling member 800 is used.

As described above, since total reflection surface 220 of light flux controlling member 800 is designed for light emitted from the center portion of the light emitting surface of light emitting element 130, most of the light emitted from center portion of the light emitting surface of light emitting element 130 is reflected by total reflection surface 220 toward light guiding section 630. On the other hand, light emitted from portion other than the center portion of the light emitting surface is not reflected by light total reflection surface 220, and may possibly be transmitted therethrough. Therefore, in a cross-section including optical axis LA and taken along the major axis of light flux controlling member 800, light paths of light emitted from an end portion of light emitting surface of light emitting element 130 were simulated. As a result, as illustrated in FIG. 16A, it was confirmed that, of the light emitted from an end portion of the light emitting surface of light emitting element 130, light having angles in a certain range is transmitted through total reflection surface 220.

As illustrated in FIG. 16A and FIG. 17, it was confirmed that, of light emitted from an end portion of light emitting surface of light emitting element 130, light that passes an end portion of the light emitting surface, and is output at angle (θ1) of 5 to 15 degrees with respect to line LA' in parallel with optical axis LA toward the center of the light emitting surface is transmitted without being reflected by total reflection surface 220, in the cross-section taken along the major axis and including the optical axis of flux controlling member 800. Also in light emitted from light emission points other than the center portion and the end portion of the light emitting surface, there is an angle range in which light is transmitted through total reflection surface 220 without being reflected by total reflection surface 220.

A simulation was performed on the distribution of light emitted from total reflection surface 220, with light that is not reflected by total reflection surface 220 and is transmitted therethrough in a case where light emitted from the entirety of the light emitting surface of light emitting element 130 was caused to incident on light flux controlling member 800. In this case, emission surface 240 of light flux controlling member 800 was shielded from light, and only light emitted from total reflection surface 220 was used for the simulation.

As a result, as illustrated in FIG. 16B and FIG. 17, in a cross-section including the optical axis and taken along the major axis of light flux controlling member 800, light L1 emitted from total reflection surface 220 has its brightness peak at an angle of about 35 degrees in both the left and right sides when optical axis LA is set at 0 degree.

Given the above, when the above-described diffusing member 820 is disposed in a region immediately above light emitting element 130 in such a manner as to cover light at least in a range up to 35 degrees with respect to optical axis LA, the travelling direction of light emitted at the highest luminous intensity in 35-degree direction can be disturbed, and the possibility of formation of a bright point in the region immediately above total reflection surface 220 can be reduced. It is to be noted that the peak angle changes depending on the size of light emitting element 130, the light distribution, and the forms of incidence surface 210 and total reflection surface 220 of light flux controlling member 800. Therefore, it is only necessary to confirm the peak angle by a simulation or measurement, and to determine the cover range of diffusing member 820 such that light in the confirmed direction is emitted through diffusing member 820.

Next, a simulation was performed on light paths of light in a case where diffusing member 820 is disposed in a region immediately above total reflection surface 220 in such a manner as to cover at least a range up to 35 degrees with respect to optical axis LA. It is to be noted that, since light travelled to light guiding section 630 is shielded, light output from light guiding section 630 was not taken into consideration.

As illustrated in FIG. 16C and FIG. 17, in the cross-section taken along the major axis of light flux controlling member 800 and including the optical axis, when diffusing member 820 is disposed in a region immediately above total reflection surface 220 in such a manner as to cover at least a range up to about 35 degrees with respect to optical axis LA, light emitted from emission surface of diffusing member 820 has its brightness peak at an angle of about 60 degrees in both the left and right sides when optical axis LA is set at 0 degree.

That is, in the cross-section taken along the major axis of light flux controlling member 800 and including the optical axis, the peak angle of light emitted from total reflection surface 220 is expanded by diffusing member 820 from 35 degrees to 60 degrees when optical axis LA is set at 0 degree. In addition, the distance of light transmitted through diffusing member 820 from cover 140 is increased in association with the increase of the peak angle of the light. Thus, a bright point is not easily formed on cover 140.

As described, diffusing member 820 diffuses light emitted from total reflection surface 220, thereby eliminating a bright point that may be formed in a region immediately above light emitting element 130. However, when the wavelength of light emitted from the light flux controlling member main body (light flux controlling member 600 of Embodiment 3) including incidence surface 210, total reflection surface 220, two light guiding sections 630 and two emission surfaces 240, and the wavelength of light emitted from diffusing member 820 are different from each other, color unevenness is caused in light flux controlling member 800. Accordingly, diffusing member 820 preferably outputs light having a wavelength characteristic which is approximately equal to that of light from the light flux controlling member main body in the visible light region. In view of this, the material of the light flux controlling member main body and the material of diffusing member 820 preferably have a transmittance difference ($\Delta T$) of 15% or lower for the light having wavelengths of 400 to 800 nm. The transmittance difference ($\Delta T$) is obtained as follows.

(Method for Obtaining Transmittance Difference ($\Delta T$))

Each material in a form of a plate having a thickness of 1 mm is irradiated with light having wavelengths of 400 to 800 nm, which fall within the visible light region, to obtain light transmittances for respective wavelengths. For each material, the minimum value ($T_{min}$) of the transmittances is subtracted from the maximum value ($T_{max}$) of the transmittances to obtain transmittance difference ($\Delta T$).

The material of the light flux controlling member main body and the material of diffusing member 820 may be the same or different as long as the above-described condition is satisfied. Examples of the material that satisfy the above-described condition of transmittance difference ($\Delta T$) include light transmissive resins such as polymethylmethacrylate (PMMA), polycarbonate (PC), polystyrene (PS), and styrene methyl methacrylate copolymerization resin (MS), and light transmissive glasses. As described, by setting the transmittance difference of the material of the light flux controlling member main body and the material of diffusing member 820 at 15% or lower, light emitted from the light flux controlling member main body and diffusing member 820 can be set to have the same color appearance.

(Effect)

As described above, since light flux controlling member 800 includes diffusing member 820 in illumination apparatus 700 of Embodiment 4, formation of a bright point in a region immediately above light emitting element 130 can be prevented. That is, since light can be uniformly emitted from the entirety of the light emission region of illumination apparatus 700, high energy efficiency and small luminance unevenness can be achieved. In addition, when the transmittance difference in the material composing light flux controlling member 800 is set to 15% or lower, formation of color unevenness can be limited.

(First Modification)

Figure 18A:
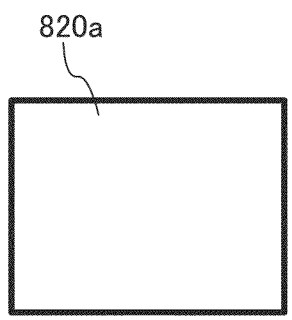
FIG. 18A is a front view of a diffusing member of a first modification of Embodiment 4.
Figure 18B:
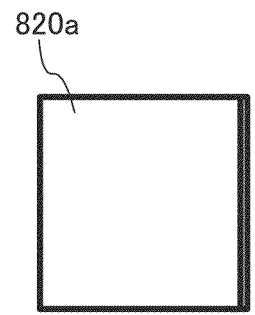
FIG. 18B is a plan view of the diffusing member of the first modification of Embodiment 4.
Figure 18C:
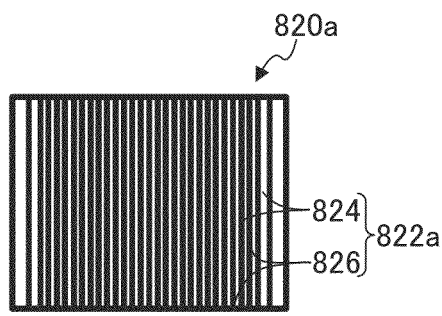
FIG. 18C is a bottom view of the diffusing member of the first modification of Embodiment 4.
Figure 18D:
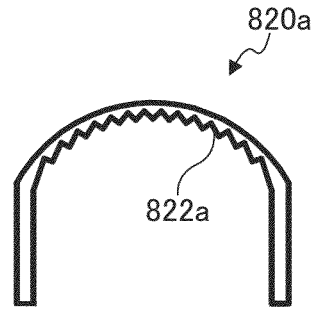
FIG. 18D is a side view of the diffusing member of Embodiment 4 modification 1.

FIGS. 18A to 18D illustrate a configuration of diffusing member 820a of a first modification of Embodiment 4. FIG. 18A is a front view of diffusing member 820a, FIG. 18B is a plan view of diffusing member 820a, FIG. 18C is a bottom view of diffusing member 820a, and FIG. 18D is a side view of diffusing member 820a.

As illustrated in FIGS. 18A to 18D, the light flux controlling member of the first modification of Embodiment 4 is different from light flux controlling member 800 of Embodiment 4 in the form of diffusing member 820a. Therefore, the same components as those of light flux controlling member 800 of Embodiment 4 are denoted by the same reference numerals, and the descriptions thereof are omitted.
(Form of Diffusion Member)

Diffusing member 820a of the first modification of Embodiment 4 includes a plurality of prism rows 822a. Prism rows 822a are disposed only on the internal surface of diffusing member 820a (substantially half cylinder portion), and each prism row 822a includes first inclined surface 824 and second inclined surface 826. Prism rows 822a are disposed in parallel with the axis of diffusing member 820a. It is to be noted that prism rows 822a are not disposed on the internal surface of the side wall in consideration of the undercut at the time of molding. In addition, the forms of prism rows 822a are not the same in consideration of the undercut.
(Second Modification)

FIGS. 19A to 19D illustrate a configuration of diffusing member 820b of a second modification of Embodiment 4. FIG. 19A is a front view of diffusing member 820b, FIG. 19B is a plan view of diffusing member 820b, FIG. 19C is a bottom view of diffusing member 820b, and FIG. 19D is a side view of diffusing member 820b.

As illustrated in FIGS. 19A to 19D, diffusing member 820b of the second modification of Embodiment 4 is different from light flux controlling member 800 of Embodiment 4 in form of diffusing member 820b. Therefore, the same components as those of light flux controlling member 800 of Embodiment 4 are denoted by the same reference numerals, and the descriptions thereof are omitted.
(Form of Diffusion Member)

Diffusing member 820b of the second modification of Embodiment 4 includes a plurality of prism rows 822b. Prism rows 822b are disposed on the outer peripheral surface of diffusing member 820b (substantially half cylinder portion), and each prism row 822a includes first inclined surface 824 and second inclined surface 826. Prism rows 822b are disposed in parallel with the axis of diffusing member 820b.
(Effect)

The illumination apparatuses including the light flux controlling members of the first and second modifications of Embodiment 4 have the same effect as illumination apparatus 700 of Embodiment 4. Although not illustrated in the drawings, the prism rows may be disposed on the external surface of the diffusing member (substantially cylinder portion) along a direction orthogonal to the axis of the diffusing member.

It is to be noted that, while the diffusing member includes a plurality of prism rows 822, 822a and 822b in Embodiment 4 and the modifications of Embodiment 4, a plurality of square pyramids may be disposed in place of prism rows 822, 822a and 822b. In this case, the square pyramids are disposed on the external surface or internal surface of the diffusing member (substantially cylinder portion). The disposing manner of the square pyramids is not particularly limited. For example, the square pyramids may be disposed such that one side on the bottom surface of the square pyramid is in parallel with the axis of the diffusing member, or one side on the bottom surface of the square pyramid is inclined (at 45 degrees for example) with respect to the axis of the diffusing member.

[Embodiment 5]
(Configuration of Illumination Apparatus)

Figure 20A:
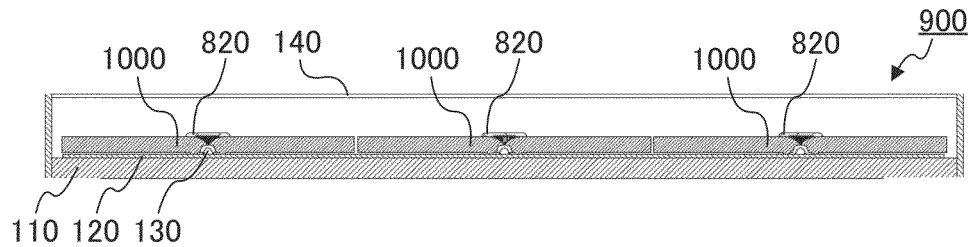
FIG. 20A is a sectional view of an illumination apparatus of Embodiment 5.
Figure 20B:
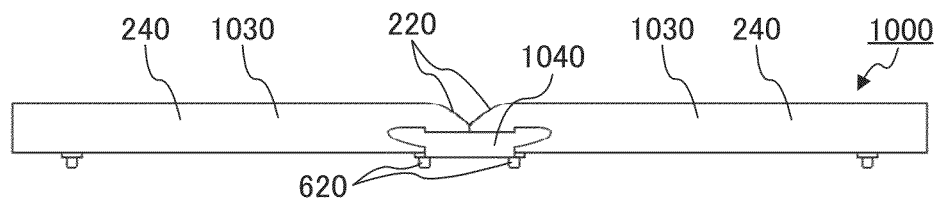
FIG. 20B is a front view of a light flux controlling member of Embodiment 5.
Figure 20C:
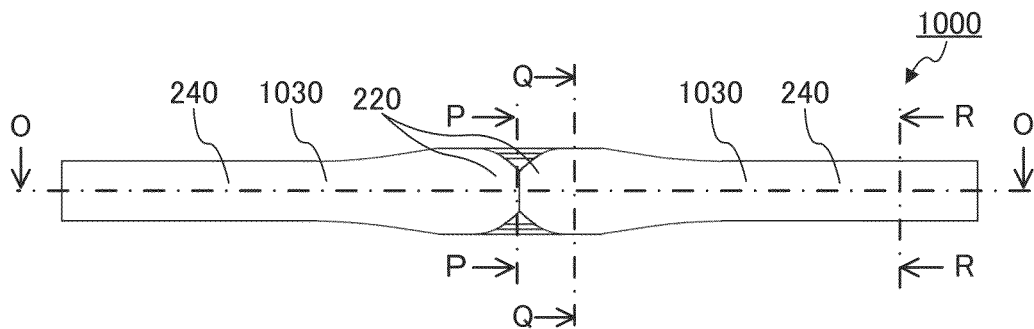
FIG. 20C is a plan view of the light flux controlling member of Embodiment 5.
Figure 20D:
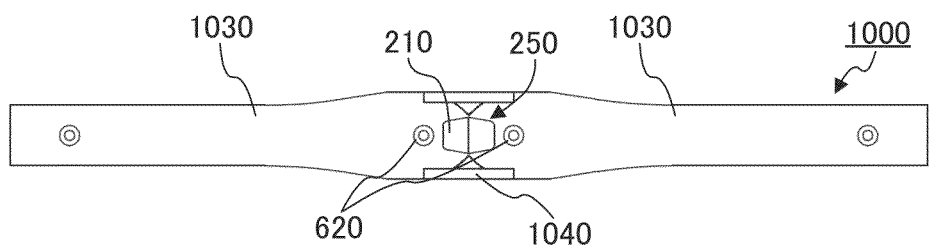
FIG. 20D is a bottom view of the light flux controlling member of Embodiment 5.
Figure 20E:
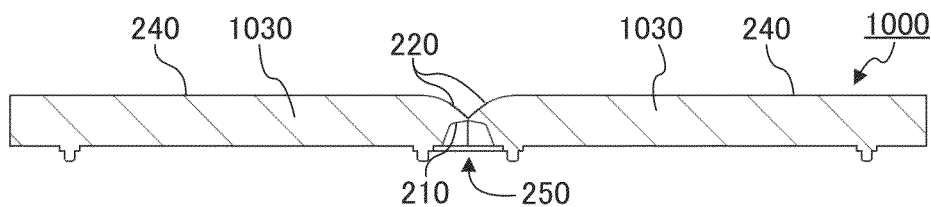
FIG. 20E is a sectional view taken along line O-O of FIG. 20C.
Figure 21A:
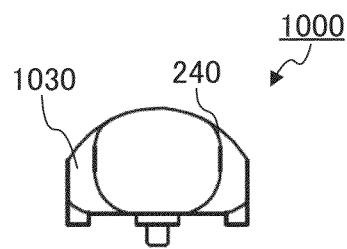
FIG. 21A is a left side view of the light flux controlling member of Embodiment 5.
Figure 21B:
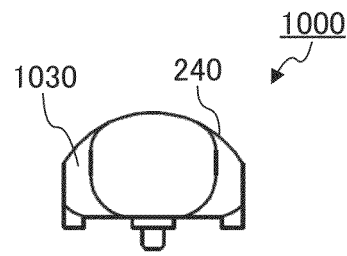
FIG. 21B is a right side view of the light flux controlling member of Embodiment 5.
Figure 21C:
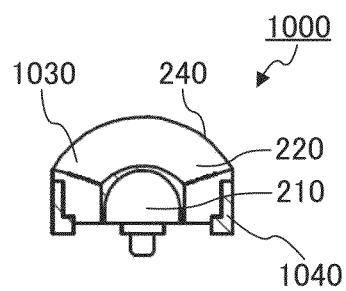
FIG. 21C is a sectional view taken along line P-P of FIG. 20C.
Figure 21D:
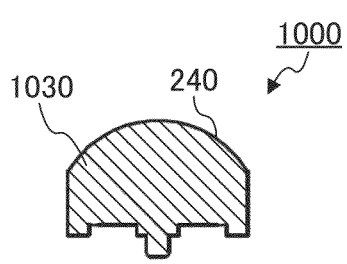
FIG. 21D is a sectional view taken along line Q-Q of FIG. 20C.
Figure 21E:
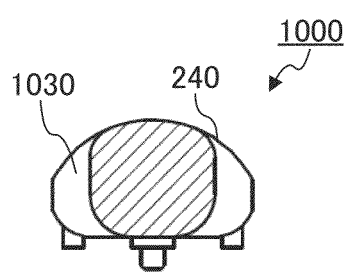
FIG. 21E is a sectional view taken along line R-R of FIG. 20C.

FIGS. 20A to 21E illustrate a configuration of illumination apparatus 900 and light flux controlling member 1000 of Embodiment 5. FIG. 20A is a sectional view of illumination apparatus 900, FIG. 20B is a front view of light flux controlling member 1000, FIG. 20C is a plan view of light flux controlling member 1000, FIG. 20D is a bottom view of light flux controlling member 1000, and FIG. 20E is a sectional view taken along line O-O of FIG. 20C. FIG. 21A is a left side view of light flux controlling member 1000, FIG. 21B is a right side view of light flux controlling member 1000, FIG. 21C is a sectional view taken along line P-P of FIG. 20C, FIG. 21D is a sectional view taken along line Q-Q of FIG. 20C, and FIG. 21E is a sectional view taken along line R-R of FIG. 20C. It is to be noted that diffusing member 820 is omitted in FIGS. 20B to 20E and FIGS. 21A to 21E.

As illustrated in FIG. 20A, illumination apparatus 900 includes frame 110, substrate 120, a plurality of light emitting elements 130, a plurality of light flux controlling members 1000 and cover 14. A pair of light emitting element 130 and light flux controlling member 1000 functions as a light-emitting device. Illumination apparatus 900 of Embodiment 5 is different from illumination apparatus 700 of Embodiment 4 in the form of light flux controlling member 1000. Therefore, the same components as those of illumination apparatus 700 of Embodiment 4 are denoted by the same reference numerals, and the descriptions thereof are omitted.
(Form of Light Flux Controlling Member)

As illustrated in FIGS. 20B to 21E, light flux controlling member 1000 of Embodiment 5 does not include a step part for attaching diffusing member 820. Thus, total reflection surface 220 and light guiding section 1030 are smoothly connected.

The cross-sectional form of reinforcement member 1040 taken along the minor axis of light flux controlling member 1000 and including optical axis LA is an L shape. In the major axis direction of light flux controlling member 1000 including optical axis LA, reinforcement member 1040 is extended to the both side surfaces of a pair of cross-sectional area changing sections that are so formed as to sandwich incidence surface 210, and thus reinforcement member 1040 joins light guiding sections 630.

Light flux controlling member 1000 of Embodiment 5 may also include any of diffusing member 820 of Embodiment 4 and diffusing members 820a and 820b of the first and second modifications of Embodiment 4. In addition, the cover ranges of diffusing members 820, 820a and 820b are also as described above.
(Effect)

As described above, since total reflection surface 220 and light guiding section 1030 (emission surface 240) are smoothly connected with each other in illumination apparatus 900 of Embodiment 5, the size of total reflection surface 220 can be increased, and discontinuity of brightness in association with the step part can be eliminated. In addition, since reinforcement member 1040 is extended to the side surfaces of light guiding section 1030, the strength can further be increased.

It is to be noted that light guiding section 230, 630 or 1030 may be divided in a plane including connecting section 222 of the total reflection surface. In this case, light guiding sections 230, 630 or 1030 are preferably connected together by a reinforcement member.

[Embodiment 6]
(Configuration of Illumination Apparatus)

Figure 22A:
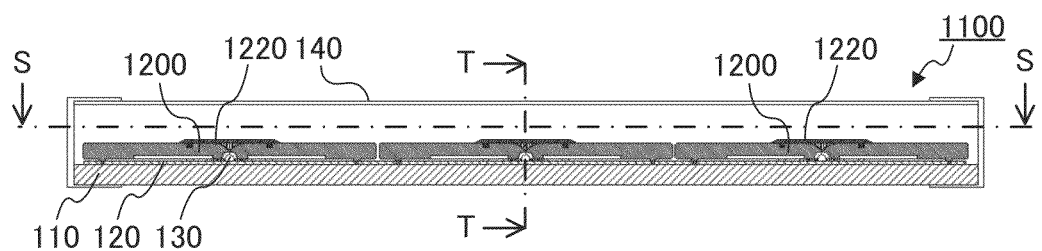
FIG. 22A is a sectional view of an illumination apparatus of Embodiment 6.
Figures 25A, 25B:
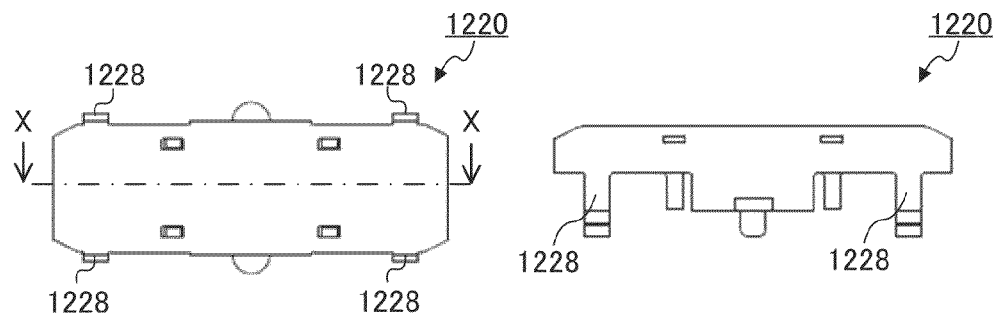
FIG. 25A is a plan view of a diffusing member of Embodiment 6.
FIG. 25B is a front view of the diffusing member of Embodiment 6.
Figures 25C, 25D:
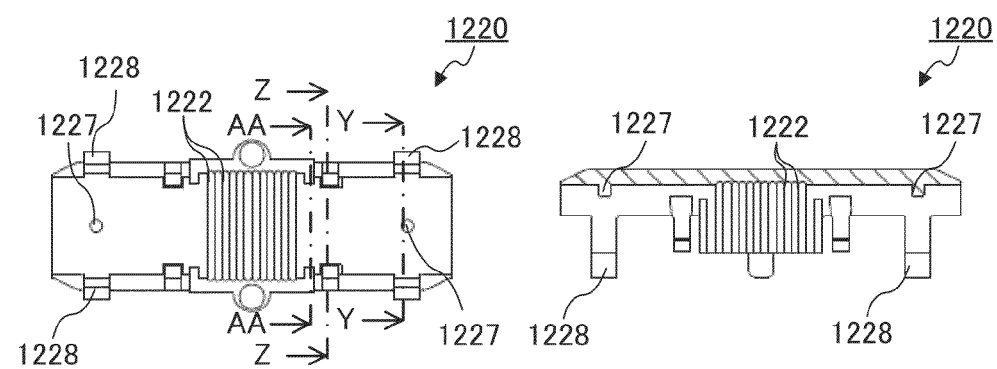
FIG. 25C is a bottom view of the diffusing member of Embodiment 6.
FIG. 25D is a sectional view taken along line X-X of FIG. 25A.
Figures 25E, 25F:
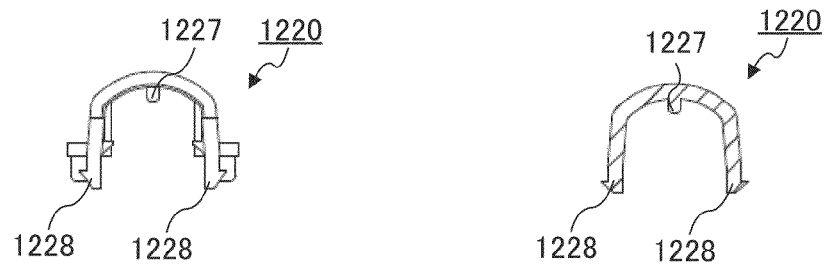
FIG. 25E is a side view of the diffusing member of Embodiment 6.
FIG. 25F is a sectional view taken along line Y-Y of FIG. 25C.
Figures 25G, 25H:
FIG. 25G is a sectional view taken along line Z-Z of FIG. 25C.
FIG. 25H is a sectional view taken along line AA-AA of FIG. 25C.
Figure 26:
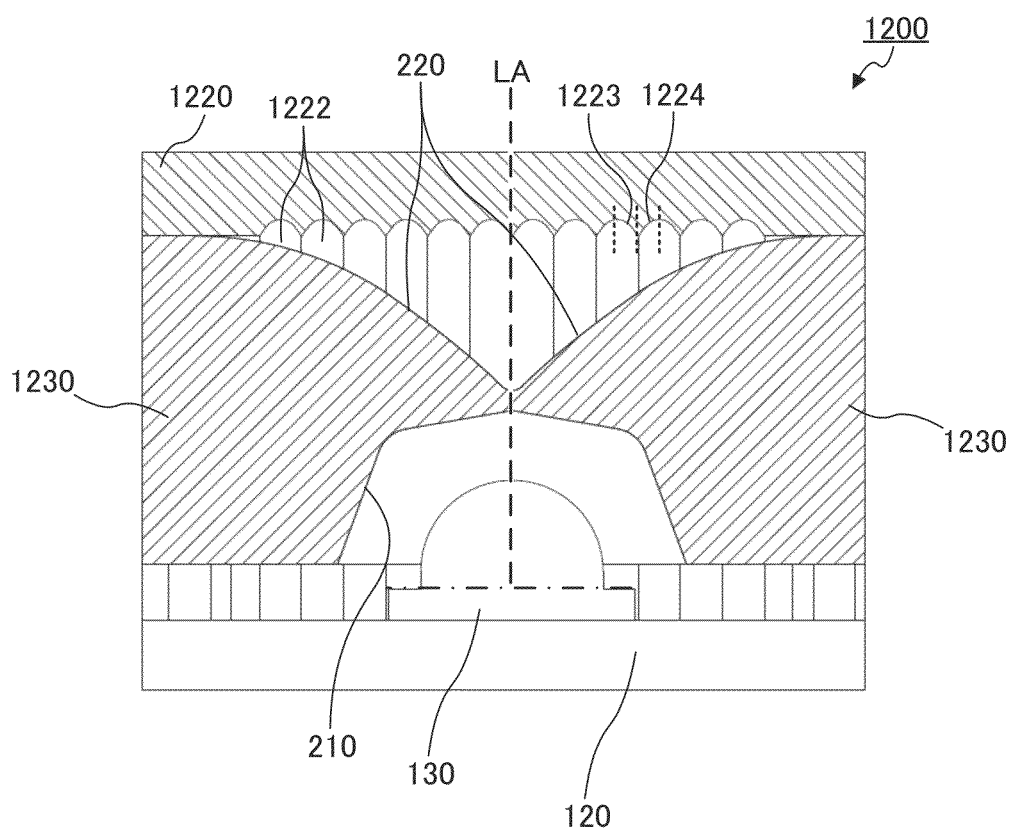
FIG. 26 is an enlarged sectional view of a center portion of the light flux controlling member of Embodiment 6.

FIGS. 22A to 26 illustrate a configuration of illumination apparatus 1100, light flux controlling member 1200 and diffusing member 1220 of Embodiment 6. FIG. 22A is a sectional view of illumination apparatus 1100 as viewed from a front surface, FIG. 22B is a sectional view taken along line S-S of FIG. 22A, and FIG. 22C is a sectional view taken along line T-T of FIG. 22A. FIG. 23A is a front view of light flux controlling member 1200, FIG. 23B is a plan view of light flux controlling member 1200, FIG. 23C is a bottom view of light flux controlling member 1200, and FIG. 23D is a sectional view taken along line U-U of FIG. 23B. FIG. 24A is a side view of light flux controlling member 1200, FIG. 24B is a sectional view taken along line V-V of FIG. 23D, and FIG. 24C is a sectional view taken along line W-W of FIG. 23D. It is to be noted that, in FIGS. 23A to 24C, diffusing member 1220 and an engagement hole engaged with auxiliary protrusion 1227 described later are omitted. FIG. 25A is a plan view of diffusing member 1220, FIG. 25B is a front view of diffusing member 1220, FIG. 25C is a bottom view of diffusing member 1220, FIG. 25D is a sectional view taken along line X-X of FIG. 25A, FIG. 25E is a side view of diffusing member 1220, FIG. 25F is a sectional view taken along line Y-Y of FIG. 25C, FIG. 25G is a sectional view taken along line Z-Z of FIG. 25C, and FIG. 25H is a sectional view taken along line AA-AA of FIG. 25C. FIG. 26 is an enlarged sectional view of a center portion of light flux controlling member 1200.

Figure 22B:
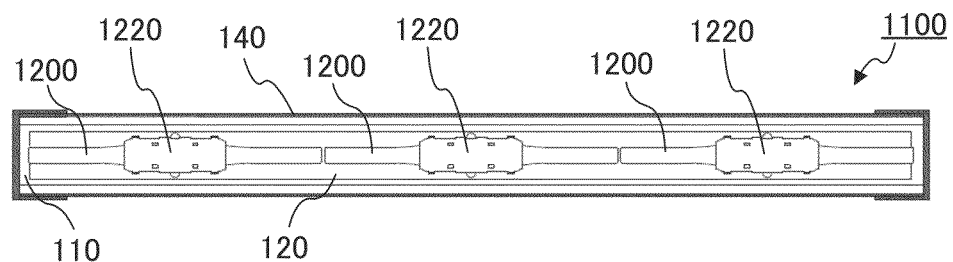
FIG. 22B is a sectional view taken along line S-S of FIG. 22A.
Figure 22C:
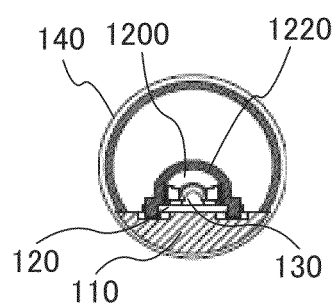
FIG. 22C is a sectional view taken along line T-T of FIG. 22A.
Figure 23A:
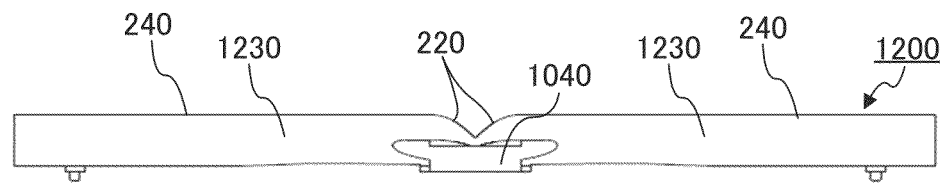
FIG. 23A is a front view of the light flux controlling member of Embodiment 6.
Figure 23B:
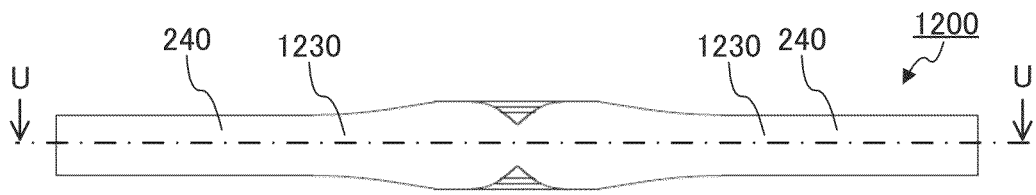
FIG. 23B is a plan view of the light flux controlling member of Embodiment 6.
Figure 23C:
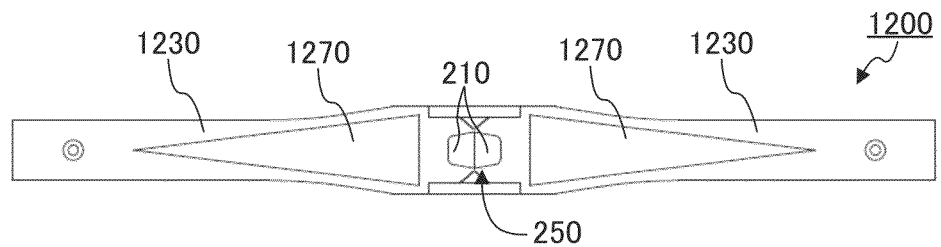
FIG. 23C is a bottom view of the light flux controlling member of Embodiment 6.
Figure 23D:
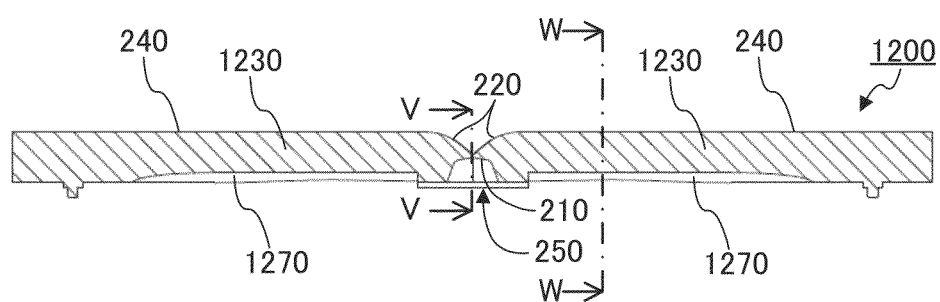
FIG. 23D is a sectional view taken along line U-U of FIG. 23B.
Figure 24A:
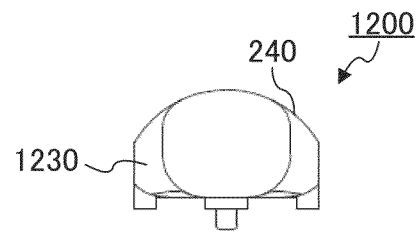
FIG. 24A is a side view of the light flux controlling member of Embodiment 6.
Figure 24B:
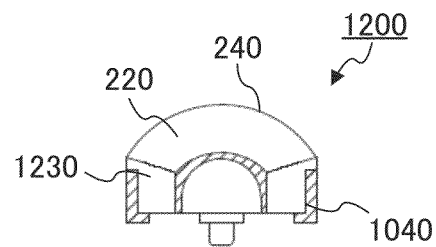
FIG. 24B is a sectional view taken along line V-V of FIG. 23D.
Figure 24C:
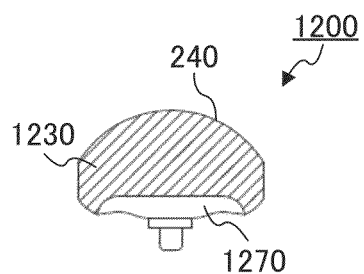
FIG. 24C is a sectional view taken along line W-W of FIG. 23D.

As illustrated in FIGS. 22A to 22C, illumination apparatus 1100 includes frame 110, substrate 120, a plurality of light emitting elements 130, a plurality of light flux controlling members 1200 and cover 140. A pair of light emitting element 130 and light flux controlling member 1200 functions as a light-emitting device. Illumination apparatus 1100 of Embodiment 6 is different from illumination apparatus 1000 of Embodiment 5 in the form of light flux controlling member 1200. Therefore, the same components as those of illumination apparatus 1000 of Embodiment 5 are denoted by the same reference numerals, and the descriptions thereof are omitted.

(Form of Light Flux Controlling Member)

As illustrated in FIGS. 22A to 26, light flux controlling member 1200 of Embodiment 6 includes a light flux controlling member main body and diffusing member 1220.

The light flux controlling member main body includes incidence surface 210, total reflection surface 220, two light guiding sections 1230 and two emission surfaces 240.

On the bottom surfaces of light guiding sections 1230 (the surface on light emitting element 130 side with respect to optical axis LA of the light emitting element direction), second recesses 1270 are respectively formed. Two second recesses 1270 are each formed in a region around the center portion of light flux controlling member 1200, but are not in communication with recess 250.

The size and form of second recess 1270 are not particularly limited as long as the desired light distribution (the light distribution which does not reduce the effect of the present invention) can be obtained and the required strength of light flux controlling member 1200 can be ensured. In the present embodiment, the form in a plan view of second recess 1270 is an isosceles triangular form whose bottom side is located on light emitting element 130 side (see FIG. 23C). The depth of second recess 1270 is constant on a side nearer to light emitting element 130, but gradually decreases as the distance from light emitting element 130 increases (see FIG. 23D). For example, the maximum depth of second recess 1270 is about 0.5 to 1.5 mm. In the minor axis direction of the light flux controlling member main body, second recess 1270 has a cross-sectional form in which the bottom portion is in a form of a line and the side portion is in a form of a curve (see FIG. 24C). That is, in the internal form of second recess 1270, the bottom portion is composed of a planar surface and the side portion is composed of a curved surface. It is to be noted that, when light flux controlling member 1200 is formed by injection molding, second recess 1270 is preferably formed at a position where a sink mark is possibly formed. With this configuration, formation of a sink mark at the time of injection molding can be limited, and the manufacturing cost can be reduced.

As illustrated in FIGS. 25A to FIG. 26, diffusing member 1220 includes a plurality of prism rows 1222, a plurality of auxiliary protrusions 1227, and a plurality of fixing nails 1228. Diffusing member 1220 of the present embodiment extends in the axis direction of diffusing member 1220 (major axis direction of the light flux controlling member main body) in comparison with diffusing members 820, 820a and 820b of Embodiment 4 and the modifications of Embodiment 4. At the both end portions of diffusing member 1220 in the major axis direction, a plurality of auxiliary protrusions 1227 and a plurality of fixing nails 1228 are disposed.

Prism rows 1222 are disposed on a part of the internal surface of diffusing member 1220 in a direction orthogonal to the axis direction of diffusing member 1220. The position where prism rows 1222 are disposed with respect to the light flux controlling member main body is the same as with prism rows 822, 822a and 822b of Embodiment 4 and modifications of Embodiment 4. Prism rows 1222 each include first curved surface 1223 and second curved surface 1224. The cross-sectional forms of first curved surface 1223 and second curved surface 1224 are each substantially a quadrant (see FIG. 26). First curved surface 1223 and second curved surface 1224 are alternately and continuously disposed.

Auxiliary protrusions 1227 are engaged with engagement holes not illustrated in the drawings that are disposed on the upper portion of light guiding section 1230 on the light emitting element 130 side, and thus auxiliary protrusions 1227 reinforce, with diffusing member 1220, parts where the strength is insufficient in the light flux controlling member main body. Auxiliary protrusions 1227 are disposed on the light flux controlling member main body side. Auxiliary protrusions 1227 are disposed at respective positions which are located on the center portion of diffusing member 1220 in the minor axis direction and are distant from light emitting element 130 in the major axis direction of diffusing member 1220 (see FIG. 25C).

Together with the light flux controlling member main body, fixing nails 1228 fix diffusing member 1220 on substrate 120. Fixing nails 1228 are formed at four corners in a plan view of diffusing member 1220 (see FIGS. 25A to 25D).

Figure 27:
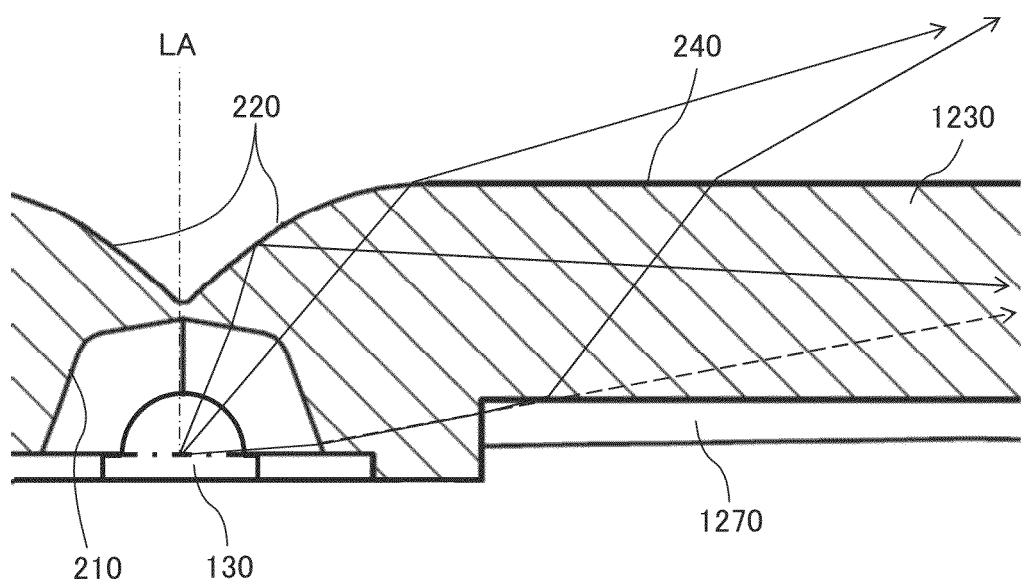
FIG. 27 illustrates light paths at a center portion of a main body of the light flux controlling member of Embodiment 6.

FIG. 27 illustrates light paths at a center portion of the light flux controlling member main body. As illustrated in FIG. 27, light emitted at a small angle with respect to optical axis LA of light emitting element 130 is incident on the light flux controlling member main body from light incidence surface 210. Since the light emitted at a small angle with respect to optical axis LA has a high luminous intensity, when total reflection surface 220 does not function and consequently the light is emitted as it is, a bright point is undesirably formed at a portion immediately above light emitting element 130. Since part of light incident on the light flux controlling member main body is reflected by total reflection surface 220 toward light guiding section 1230 in the present embodiment, formation of a bright point at a portion in the vicinity of light emitting element 130 is limited (a dark point is easily formed at a portion in the vicinity of light emitting element 130). On the other hand, light emitted at a large angle with respect to optical axis LA is also incident on the light flux controlling member main body from incidence surface 210. Part of the light incident on the light flux controlling member main body once passes through the inside of second recess 1270 (output from the light flux controlling member main body), and is again incident on the light flux controlling member main body. This light is output from emission surface 240 of light guiding section 1230 toward cover 140. As described, light (represented by a solid line in FIG. 27) that is emitted at a large angle with respect to optical axis LA and refracted by being passed through second recess 1270 before output from emission surface 240 is output from a region nearer to optical axis LA with respect to the light guided in the light flux controlling member main body having no second recess 1270 (represented by a broken line in FIG. 27). Thus, formation of a dark point in a region around light emitting element 130 can be limited.

(Effect)

As described above, illumination apparatus 1100 of Embodiment 6 has an effect similar to that of illumination apparatus 900 of Embodiment 5. In addition, since second recess 1270 is formed in light guiding section 1230 in light flux controlling member 1200 of Embodiment 6, the weight and material cost can be reduced in comparison with light flux controlling member 1000 of Embodiment 5. In addition, the cross-sectional form of the incidence surface of each prism row 1222 is rounded, and thus the direction of light emitted toward cover 140 can be adjusted.

(First Modification)

Figure 28A:
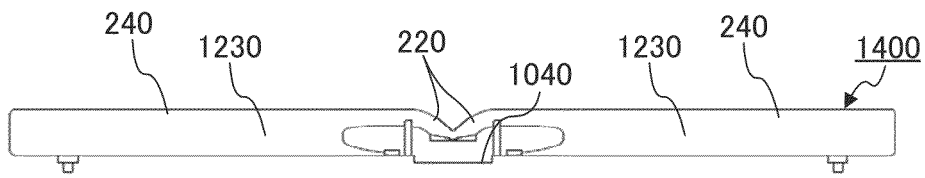
FIG. 28A is a front view of a light flux controlling member of a first modification of Embodiment 6.
Figure 28B:
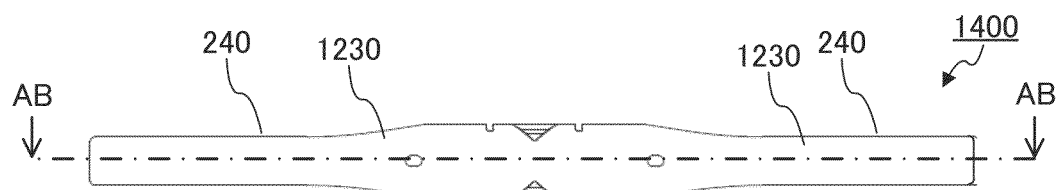
FIG. 28B is a plan view of the light flux controlling member the first modification of Embodiment 6.
Figure 28C:
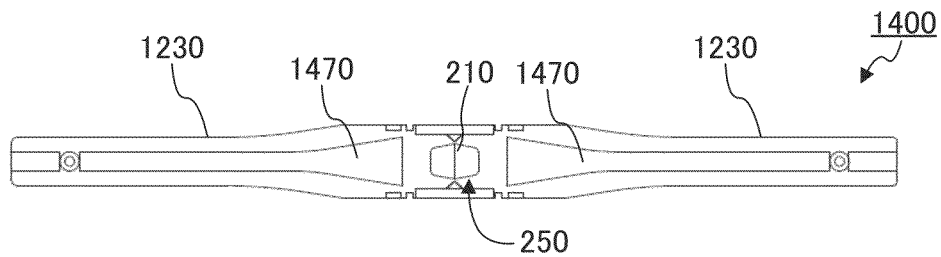
FIG. 28C is a bottom view of the light flux controlling member of the first modification of Embodiment 6.
Figure 28D:
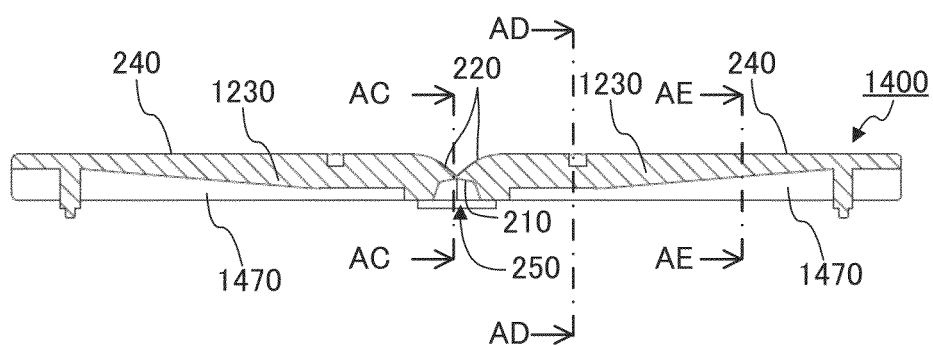
FIG. 28D is a sectional view taken along line AB-AB of FIG. 28B.
Figure 29A:
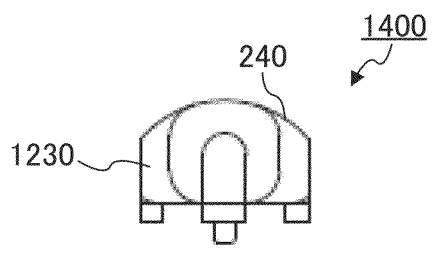
FIG. 29A is a side view of the light flux controlling member of the first modification of Embodiment 6.
Figure 29B:
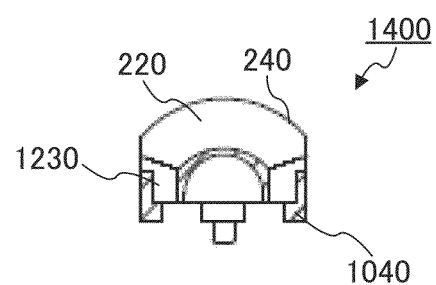
FIG. 29B is a sectional view taken along line AC-AC of FIG. 28D.
Figure 29C:
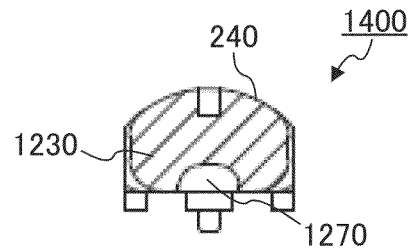
FIG. 29C is a sectional view taken along line AD-AD of FIG. 28D.
Figure 29D:
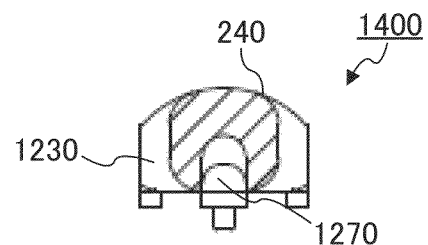
FIG. 29D is a sectional view taken along line AE-AE of FIG. 28D.

FIGS. 28A to FIG. 29D illustrate a configuration of light flux controlling member 1400 of a first modification of Embodiment 6. FIG. 28A is a front view of light flux controlling member 1400, FIG. 28B is a plan view of light flux controlling member 1400, FIG. 28C is a bottom view of light flux controlling member 1400, and FIG. 28D is a sectional view taken along line AB-AB of FIG. 28B. FIG. 29A is a side view of light flux controlling member 1400, FIG. 29B is a sectional view taken along line AC-AC of FIG. 28D, FIG. 29C is a sectional view taken along line AD-AD of FIG. 28D, and FIG. 29D is a sectional view taken along line AD-AD of FIG. 28D. It is to be noted that diffusing member 1220 is omitted in FIG. 28A to 29D.

As illustrated in FIG. 28A to 29D, light flux controlling member 1400 of the first modification of Embodiment 6 is different from light flux controlling member 1200 of Embodiment 6 in the form of second recess 1470 of the light flux controlling member main body. Therefore, the same components as those of light flux controlling member 1200 of Embodiment 6 are denoted by the same reference numerals, and the descriptions thereof are omitted.

(Form of Light Flux Controlling Member)

In light flux controlling member 1400 of the first modification of Embodiment 6, one end portion of second recess 1470 is located on light emitting element 130 side, and the other end portion thereof reaches the side surface of light flux controlling member 1400 in the major axis direction (see FIG. 28C and FIG. 28D). The depth of second recess 1470 is small on light emitting element 130 side (the side nearer to the center of light flux controlling member 1400), and is great on the side surface side of light flux controlling member 1400 (the side nearer to the end portion of light flux controlling member 1400). In addition, the depth of second recess 1470 at the center portion of light guiding section 1230 is formed such that the depth gradually increases as the distance from light emitting element 130 increases. In addition, the cross-sectional form of second recess 1470 at a portion on light emitting element 130 side in the minor axis direction is a semicircular foam (see FIG. 29C), and the cross-sectional form of second recess 1470 at a portion on the side surface side of light flux controlling member 1400 in the minor axis direction is a temple bell form (see FIG. 29D).

As described above, an illumination apparatus including light flux controlling member 1400 of the first modification of Embodiment 6 has an effect similar to that of illumination apparatus 1100 including light flux controlling member 1200 of Embodiment 6. In addition, since the size of second recess 1470 is greater than that of second recess 1270 of Embodiment 6, the weight can further be reduced.

(Second Modification)

Figure 30A:
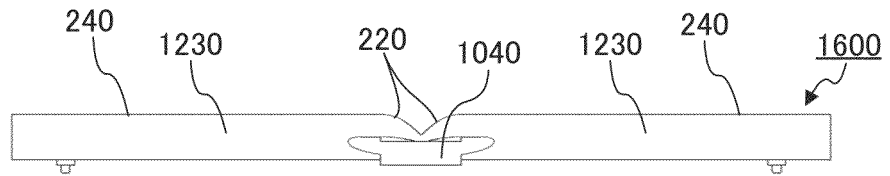
FIG. 30A is a front view of a light flux controlling member of a second modification of Embodiment 6.
Figure 30B:
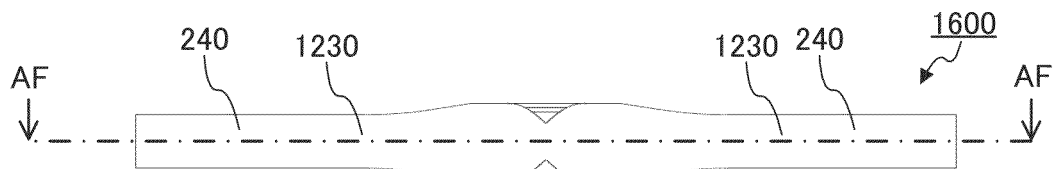
FIG. 30B is a plan view of the light flux controlling member of the second modification of Embodiment 6.
Figure 30C:
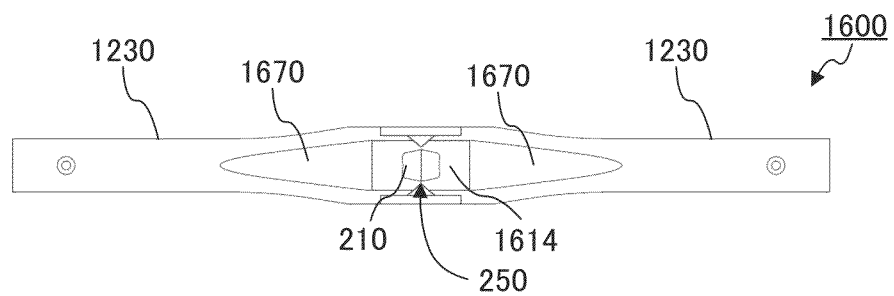
FIG. 30C is a bottom view of the light flux controlling member of the second modification of Embodiment 6.
Figure 30D:
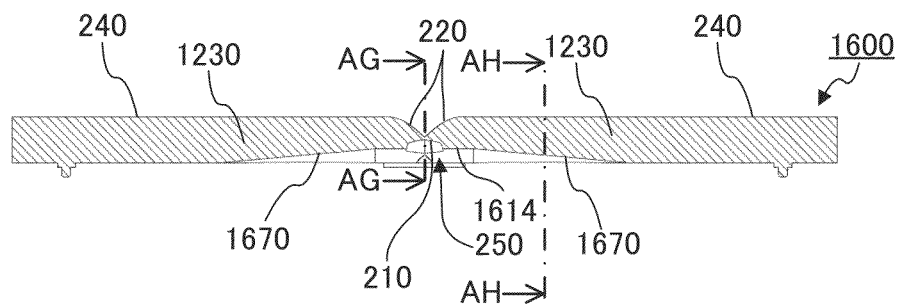
FIG. 30D is a sectional view taken along line AF-AF of FIG. 30B.
Figure 31A:
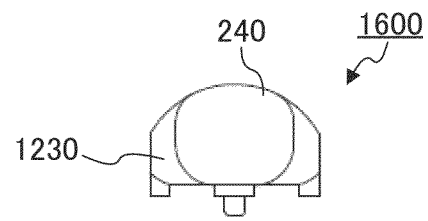
FIG. 31A is a side view of the light flux controlling member of the second modification of Embodiment 6.
Figure 31B:
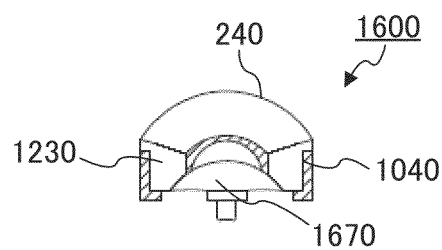
FIG. 31B is a sectional view taken along line AG-AG of FIG. 30D.
Figure 31C:
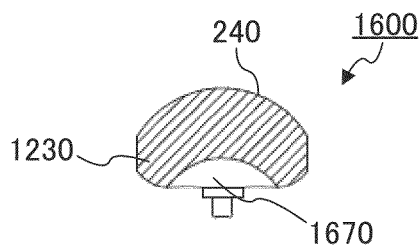
FIG. 31C is a sectional view taken along line AH-AH of FIG. 30D.

FIGS. 30A to 31C illustrate a configuration of light flux controlling member 1600 of a second modification of Embodiment 6. FIG. 30A is a front view of light flux controlling member 1600, FIG. 30B is a plan view of light flux controlling member 1600, FIG. 30C is a bottom view of light flux controlling member 1600, and FIG. 30D is a sectional view taken along line AF-AF of FIG. 30B. FIG. 31A is a side view of light flux controlling member 1600, FIG. 31B is a sectional view taken along line AG-AG of FIG. 30D, and FIG. 31C is a sectional view taken along line AH-AH of FIG. 30D. It is to be noted that diffusing member 1220 is omitted in FIGS. 30A to 31C.

As illustrated in FIGS. 30A to 31C, light flux controlling member 1600 of the second modification of Embodiment 6 is different from light flux controlling member 1200 of Embodiment 6 in the form of second recess 1670. Therefore, the same components as those of light flux controlling member 1200 of Embodiment 6 are denoted by the same reference numerals, and the descriptions thereof are omitted.

(Form of Light Flux Controlling Member)

One of second recesses 1670 of the second modification of Embodiment 6 is in communication with the other of second recesses 1670 at an end portion on light emitting element 130 side (see FIG. 30C and FIG. 30D). Therefore, in the present modification, part of incidence surface 210 on light emitting element 130 side is cut out by second recess 1670.

The depth of second recess 1670 is constant on a side nearer to light emitting element 130, but is gradually reduced as the distance from light emitting element 130 increases. The cross-sectional form of second recess 1670 in the minor axis direction of the light flux controlling member main body has a form which is obtained by cutting out part of a circle (see FIG. 31B and FIG. 31C).

Second recess 1670 includes on the internal surface thereof second incidence surface 1614 on which part of light emitted from light emitting element 130 is incident. That is, part of the internal surface of second recess 1670 functions as second incidence surface 1614. On second incidence surface 1614, light emitted at a large angle with respect to optical axis LA is incident. Second incidence surface 1614 is disposed on the internal surface of second recess 1670, on a side nearer to light emitting element 130. In addition, second incidence surface 1614 is disposed in such a manner as to surround incidence surface 210, and is connected to the opening edge of incidence surface 210.

Figure 32A:
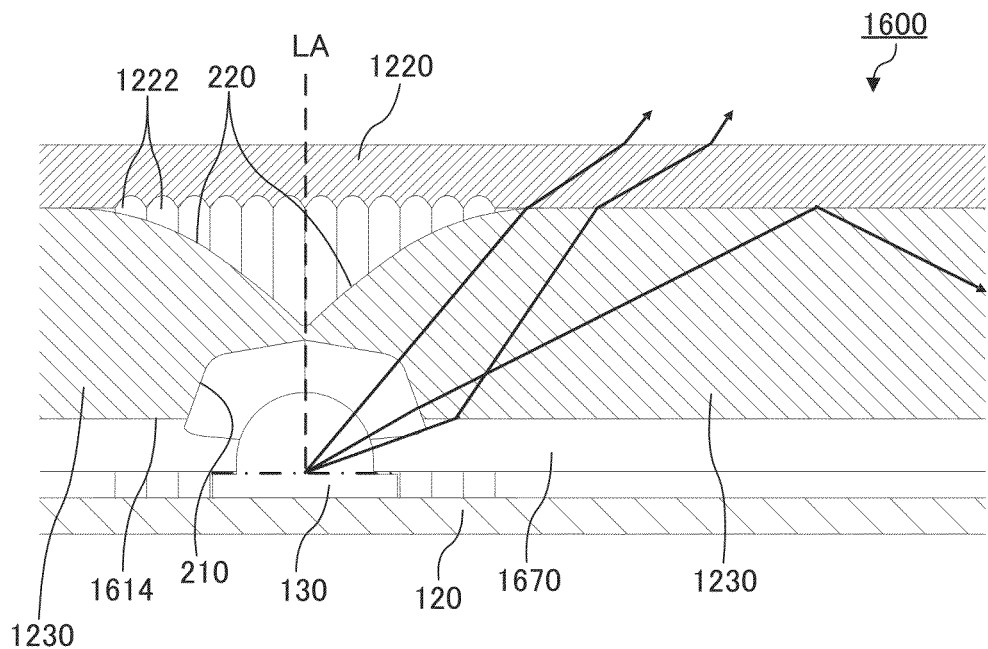
FIG. 32A is a schematic view illustrating light paths in a light flux controlling member in which a maximum depth of a recess is 1.0 mm.
Figure 32B:
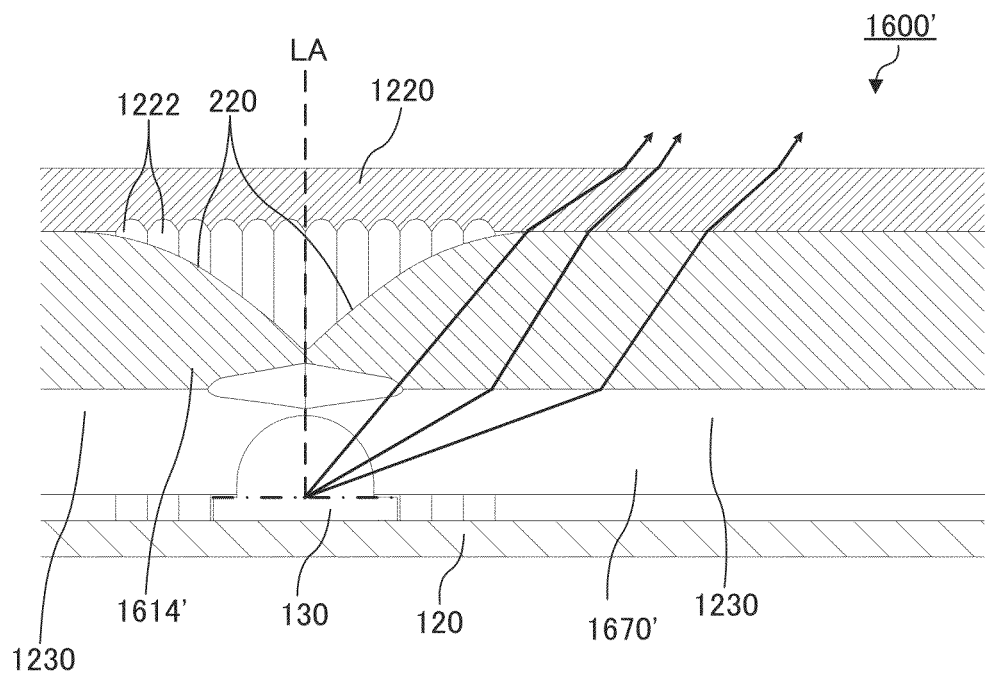
FIG. 32B is a schematic view illustrating light paths in a light flux controlling member in which a maximum depth of a recess is 2.0 mm.

FIG. 32A illustrates light paths at a center portion of light flux controlling member 1600 in which the maximum depth of second recess 1670 is 1.0 mm. FIG. 32B illustrates light paths at a center portion of light flux controlling member 1600' in which the maximum depth of second recess 1670 is 2.0 mm.

As illustrated in FIG. 32A, in light flux controlling member 1600 in which the maximum depth of second recess 1670 is 1.0 mm, light emitted at a small angle with respect to optical axis LA is incident on light flux controlling member 1600 from light incidence surface 210. Since the light emitted at a small angle with respect to optical axis LA has a high luminous intensity, when total reflection surface 220 does not function and the light is emitted as it is, a bright point is undesirably formed at a portion immediately above light emitting element 130. Since part of light incident on light flux controlling member 1600 is reflected by total reflection surface 220 toward light guiding section 1230 in the present embodiment, formation of a bright point at a portion immediately above light emitting element 130 is limited (in other words, a dark point may be formed at a portion immediately above light emitting element 130). On the other hand, light emitted at a large angle with respect to optical axis LA is incident on light flux controlling member 1600 from second incidence surface 1614. Part of this light is output from a region nearer to optical axis LA with respect to light having entered from incidence surface 210. Thus, a dark point that is easily formed at a portion immediately above light emitting element 130 is limited. On the other hand, as illustrated in FIG. 32B, in light flux controlling member 1600' in which the maximum depth of second recess 1670' is 2.0 mm, the amount of light entering from second incidence surface 1614' is great in comparison with light flux controlling member 1600 having second recess 1670 whose maximum depth is 1.0 mm. Consequently, the amount of light output toward a portion immediately above light emitting element 130 is great, and thus a bright point may be formed at a portion immediately above light emitting element 130. Accordingly, it is preferable to appropriately adjust the maximum depth of second recess 1670 in consideration of the balance between light output from a region around light emitting element 130 and light travelling in light guiding section 1230, in order not to cause luminance unevenness.

As described above, light flux controlling member 1600 of the second modification of Embodiment 6 has an effect similar to that of light flux controlling member 1200 of Embodiment 6.

(Simulation of Illuminance Distribution of Illumination Apparatus)

A simulation was performed on an illuminance distribution of an illumination apparatus having a light flux controlling member main body including a second recess. As the light flux controlling member main body, the light flux controlling member main body of Embodiment 6 in which second recesses 1270 are not in communication with each other, and light flux controlling member main bodies in which second recesses 1670 are in communication with each other and the maximum depth of second recess 1670 is 0.5, 1.0, 1.5, or 2.0 mm were used. In addition, for comparison, a simulation was also performed on an illumination apparatus including light flux controlling member 1000 of Embodiment 5 having no second recess.

One light emitting element 130 (white LED) was disposed on substrate 120, and a light flux controlling member main body having a length of 100 mm was disposed on light emitting element 130. The outer diameter of cover 140 was 26 mm. It is to be noted that diffusing member 1220 was not disposed in these illumination apparatuses.

Figure 33A:
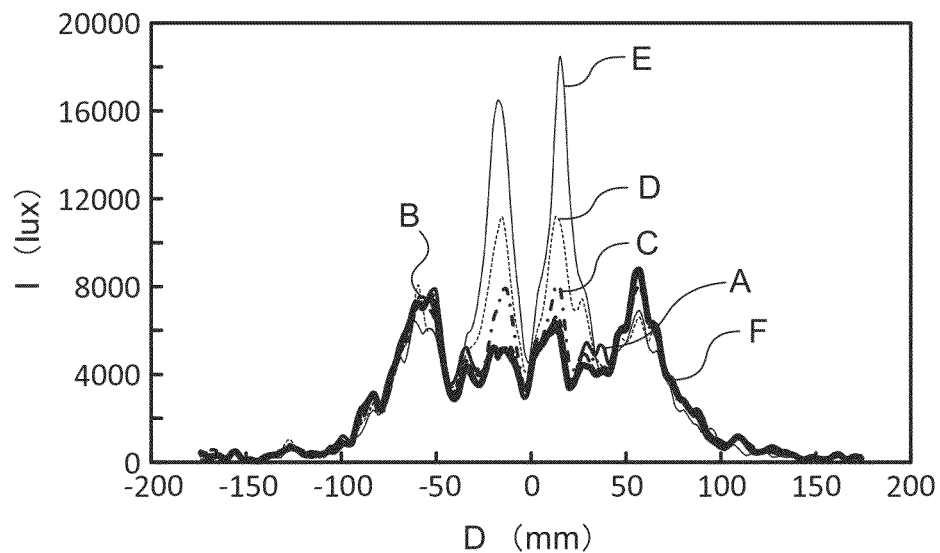
FIG. 33A is a graph illustrating results of a simulation of an illuminance distribution of a planar surface of the illumination apparatus.
Figure 33B:
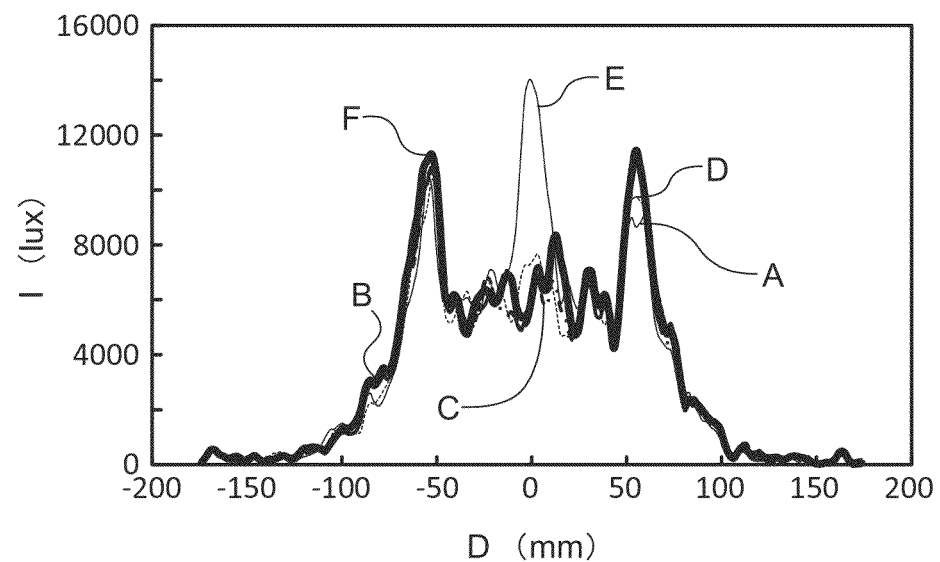
FIG. 33B is a graph illustrating results of a simulation of an illuminance distribution of a front surface of the illumination apparatus.

FIG. 33A is a graph illustrating results of a simulation of the illuminance distribution on the upper side of the illumination apparatuses, and FIG. 33B is a graph illustrating results of a simulation on the near side (front surface side) of the illumination apparatuses. The abscissa represents the position of illumination apparatus 100 in the major axis direction (D; mm), and the center point where light emitting element 130 is disposed is "0." The ordinate represents the illuminance (I; lux) at each point when the external surface (exterior surface) of cover 140 is assumed to be the illuminated surface. In FIGS. 33A and 33B, solid line A represents the luminance distribution of an illumination apparatus including light flux controlling member 1000 having no recess, broken line B represents the luminance distribution of an illumination apparatus including a light flux controlling member main body in which the maximum depth of the recess is 0.5 mm, dashed line C represents the luminance distribution of an illumination apparatus including a light flux controlling member main body in which the maximum depth of the recess is 1.0 mm, broken line D represents the luminance distribution of an illumination apparatus including a light flux controlling member main body in which the maximum depth of the recess is 1.5 mm, solid line E represents the luminance distribution of an illumination apparatus including a light flux controlling member main body in which the maximum depth of the recess is 2.0 mm, and solid line F represents the luminance distribution of an illumination apparatus including a light flux controlling member main body in which a second recesses are not in communication with each other. It is to be noted that, in positions in the major axis direction of the illumination apparatus, the peaks around +60 mm and −60 mm are associated with light emitted from the side surfaces of the light flux controlling member.

As illustrated in FIG. 33A and FIG. 33B, in the light flux controlling member main bodies in which the maximum depth of second recess 1670 is 0.5, 1.0, or 1.5 mm (light flux controlling member 1600 of the second modification of Embodiment 6) and the light flux controlling member main body in which second recesses 1270 are not in communication with recess 250 (light flux controlling member 1200 of Embodiment 6), the illuminance on the external surface of cover 140 in association with light emitted from the end portion of light guiding section and the illuminance on the external surface of cover 140 in association with light emitted from a region around the center portion were substantially the same, and the luminance unevenness was small. On the other hand, in light flux controlling member main body 1600' in which the maximum depth of second recess 1670' is 2.0 mm, the illuminance on the external surface of cover 140 in association with light emitted from a region around the center portion was significantly greater than the illuminance on the external surface of cover 140 in association with light emitted from the end portion of light guiding section 1230, and thus significant luminance unevenness was undesirably caused. Accordingly, in the light flux controlling member main bodies used herein, the maximum depth of the second recess preferably falls within the range of 0.0 to 1.5 mm.

This application is entitled to and claims the benefit of Japanese Patent Application No. 2012-093813 filed on Apr. 17, 2012, Japanese Patent Application No. 2012-263162 filed on Nov. 30, 2012, and Japanese Patent Application No. 2013-046735 filed on Mar. 8, 2013, the disclosure each of which including the specification, drawings and abstract is incorporated herein by reference in its entirety.

INDUSTRIAL APPLICABILITY

The illumination apparatus of the embodiments of the present invention can be used in place of fluorescent tubes, and is therefore widely applicable to various kinds of illumination apparatus.

REFERENCE SIGNS LIST 100, 300, 500, 700, 900, 1100 Illumination apparatus
110 Frame
120 Substrate
130 Light emitting element
140 Cover
200, 400, 600, 800, 1000, 1200, 1400, 1600, 1600' Light flux controlling member
210 Incidence surface
220 Total reflection surface 222 Connecting section of total reflection surfaces
230, 630, 1030, 1230 Light guiding section
240, 410, 420 Emission surface
250 Recess
430 Leg
440 Reinforcement plate
620 Positioning protrusion
640, 1040 Reinforcement member
820, 820a, 820b, 1220 Diffusing member
822, 822a, 822b, 1222 Prism rows
824 First inclined surface
826 Second inclined surface
1223 First curved surface
1224 Second curved surface
1227 Auxiliary protrusion
1228 Fixing nails
1270, 1470, 1670, 1670' Second recess
1614, 1614' Second incidence surface

The invention claimed is:

1. A light flux controlling member configured to control a distribution of light emitted from a light emitting element, the light flux controlling member comprising:
an incidence surface on which at least part of light emitted from a light emitting element is incident;
a total reflection surface formed at a position facing the light emitting element with the incidence surface therebetween, the total reflection surface being configured to reflect part of light incident on the incidence surface in two opposite directions substantially perpendicular to an optical axis of the light emitting element, and to output the other part of the light incident on the incidence surface;
two light guiding sections formed at positions facing each other with the incidence surface and the total reflection surface therebetween, the two light guiding sections being configured to guide part of light incident on the incidence surface and light reflected by the total reflection surface in a direction away from the incidence surface and the total reflection surface;
two emission surfaces formed on respective external surfaces of the two light guiding sections, the two emission surfaces being configured to output light guided by the light guiding sections-; and
a diffusing member disposed immediately above a position of the light emitting element in such a manner as to cover at least a part of the total reflection surface, the diffusing member including a plurality of prism rows or a plurality of square pyramids disposed on an external surface or an internal surface of the diffusing member, the prism rows and the square pyramids being configured to diffuse light, wherein
a longitudinal section of the incidence surface includes an edge, and a cross section of the incidence surface is formed of a curve without any edge, the longitudinal section being cut along the two opposite directions and including the optical axis, the cross section being perpendicular to the longitudinal section and including the optical axis,
the light output from the total reflection surface is refractively transmitted through the diffusing member.

2. The light flux controlling member according to claim 1, wherein the external surface of the total reflection surface and the internal surface of the diffusing member are disposed with an air layer therebetween.

3. The light flux controlling member according to claim 1, wherein part of light incident on the incidence surface is output without reaching the total reflection surface and the light guiding section.

4. The light flux controlling member according to claim 3, wherein the two light guiding sections are each provided with a cross-sectional area changing section whose cross-sectional area decreases as distances from the incidence surface and the total reflection surface increase.

5. The light flux controlling member according to claim 1, wherein the two light guiding sections are each provided with a recess on a side nearer to the light emitting element with respect to a light axis direction of the light emitting element.

6. The light flux controlling member according to claim 5, wherein
an internal surface of the recess includes a second incidence surface on which part of light emitted from the light emitting element is incident, and
light incident on the second incidence surface reaches the light guiding section without reaching the total reflection surface.

7. The light flux controlling member according to claim 1, wherein a material of the light flux controlling member and a material of the diffusing member have a transmittance difference ($\Delta T$) of 15% or lower for light having wavelengths of 400 to 800 nm, the transmittance difference ($\Delta T$) being obtained as follows:
each material in a form of a plate having a thickness of 1 mm is irradiated with light having wavelengths of 400 to 800 nm to obtain light transmittances for the wavelengths, and a minimum value (Tmin) of the transmittances is subtracted from a maximum value (Tmax) of the transmittances to obtain transmittance difference ($\Delta T$).

8. A light-emitting device comprising:
the light flux controlling member according to claim 1; and
a light emitting element disposed at a position facing the incidence surface.

9. An illumination apparatus comprising:
the light-emitting device according to claim 8; and
a cover that is disposed in such a manner as to cover the light-emitting device with an air layer interposed between the light-emitting device and the cover.

* * * * *